(12) United States Patent
Pisek

(10) Patent No.: US 9,100,052 B2
(45) Date of Patent: Aug. 4, 2015

(54) QC-LDPC CONVOLUTIONAL CODES ENABLING LOW POWER TRELLIS-BASED DECODERS

(71) Applicant: Eran Pisek, Plano, TX (US)

(72) Inventor: Eran Pisek, Plano, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 27 days.

(21) Appl. No.: 14/033,229

(22) Filed: Sep. 20, 2013

(65) Prior Publication Data

US 2014/0223254 A1    Aug. 7, 2014

Related U.S. Application Data

(60) Provisional application No. 61/759,874, filed on Feb. 1, 2013, provisional application No. 61/846,391, filed on Jul. 15, 2013.

(51) Int. Cl.
| | |
|---|---|
| H03M 13/00 | (2006.01) |
| H03M 13/25 | (2006.01) |
| H03M 13/03 | (2006.01) |
| H03M 13/11 | (2006.01) |
| H03M 13/41 | (2006.01) |

(52) U.S. Cl.
CPC .......... *H03M 13/256* (2013.01); *H03M 13/033* (2013.01); *H03M 13/116* (2013.01); *H03M 13/1154* (2013.01); *H03M 13/41* (2013.01)

(58) Field of Classification Search
None
See application file for complete search history.

(56) References Cited

U.S. PATENT DOCUMENTS

| | | | | |
|---|---|---|---|---|
| 7,805,652 | B1* | 9/2010 | Varnica | 714/752 |
| 8,205,131 | B2* | 6/2012 | Oh et al. | 714/752 |
| 8,341,492 | B2* | 12/2012 | Shen et al. | 714/758 |
| 2006/0190799 | A1* | 8/2006 | Kan et al. | 714/758 |
| 2006/0192691 | A1* | 8/2006 | Kan et al. | 341/50 |
| 2007/0011569 | A1* | 1/2007 | Vila Casado et al. | 714/758 |
| 2008/0168333 | A1* | 7/2008 | Yamamoto et al. | 714/780 |
| 2009/0019333 | A1* | 1/2009 | McEvoy et al. | 714/752 |
| 2009/0158128 | A1* | 6/2009 | Yokokawa et al. | 714/780 |
| 2010/0067605 | A1* | 3/2010 | Jongren | 375/267 |
| 2010/0162074 | A1* | 6/2010 | Oh et al. | 714/752 |
| 2013/0086455 | A1* | 4/2013 | Pisek | 714/776 |
| 2014/0298129 | A1* | 10/2014 | Wu et al. | 714/752 |

* cited by examiner

Primary Examiner — Daniel McMahon

(57) ABSTRACT

A low-density parity check (LDPC) encoding method for increasing constraint length includes determining a LDPC code block H-matrix including a systematic submatrix ($H_{sys}$) of input systematic data and a parity check submatrix ($H_{par}$) of parity check bits. The method includes diagonalizing the parity check submatrix ($H_{par}$). The method includes identifying a set of rows of the H-matrix that form a complete set of the input systematic data. The method includes selecting an input bit granularity ($\gamma$) and encoding latency. The method further includes obtaining a quasi-cyclic LDPC (QC-LDPC) convolutional code H-Matrix. Further, the method includes combining the set of rows into a single row.

20 Claims, 13 Drawing Sheets

FIG. 3

Matrix 300, with $H_{sys}(i,k)$ 302 (columns 0–7) and $H_{par}(i,k)$ 304 (columns 0–7). Arrows 306 and 308 point to entries at the top.

| i \ k | \multicolumn{8}{c}{$H_{sys}(i,k)$ 302} | \multicolumn{8}{c}{$H_{par}(i,k)$ 304} |
|---|---|---|---|---|---|---|---|---|---|---|---|---|---|---|---|---|
|   | 0 | 1 | 2 | 3 | 4 | 5 | 6 | 7 | 0 | 1 | 2 | 3 | 4 | 5 | 6 | 7 |
| 0 | 40 | -1 | 38 | -1 | 13 | -1 | 5  | -1 | 18 | -1 | -1 | -1 | -1 | -1 | -1 | -1 |
| 1 | 34 | -1 | 35 | -1 | 27 | -1 | -1 | 30 | 2  | 1  | -1 | -1 | -1 | -1 | -1 | -1 |
| 2 | -1 | 36 | -1 | 31 | -1 | 7  | -1 | 34 | -1 | 10 | 41 | 6  | -1 | -1 | -1 | -1 |
| 3 | -1 | 27 | -1 | 18 | -1 | 12 | 20 | -1 | -1 | -1 | 15 | 3  | 28 | -1 | -1 | -1 |
| 4 | 35 | -1 | 41 | -1 | 40 | -1 | 39 | 4  | 28 | -1 | -1 | 27 | -1 | 23 | -1 | -1 |
| 5 | 29 | -1 | 0  | -1 | -1 | 22 | -1 | 20 | -1 | 28 | -1 | -1 | -1 | 0  | 13 | -1 |
| 6 | -1 | 31 | -1 | 23 | -1 | 21 | -1 | 14 | -1 | -1 | 12 | -1 | 13 | -1 | 22 | -1 |
| 7 | -1 | 22 | -1 | 34 | 31 | -1 | 14 | -1 | 4  | -1 | -1 | -1 | -1 | -1 | -1 | 24 |

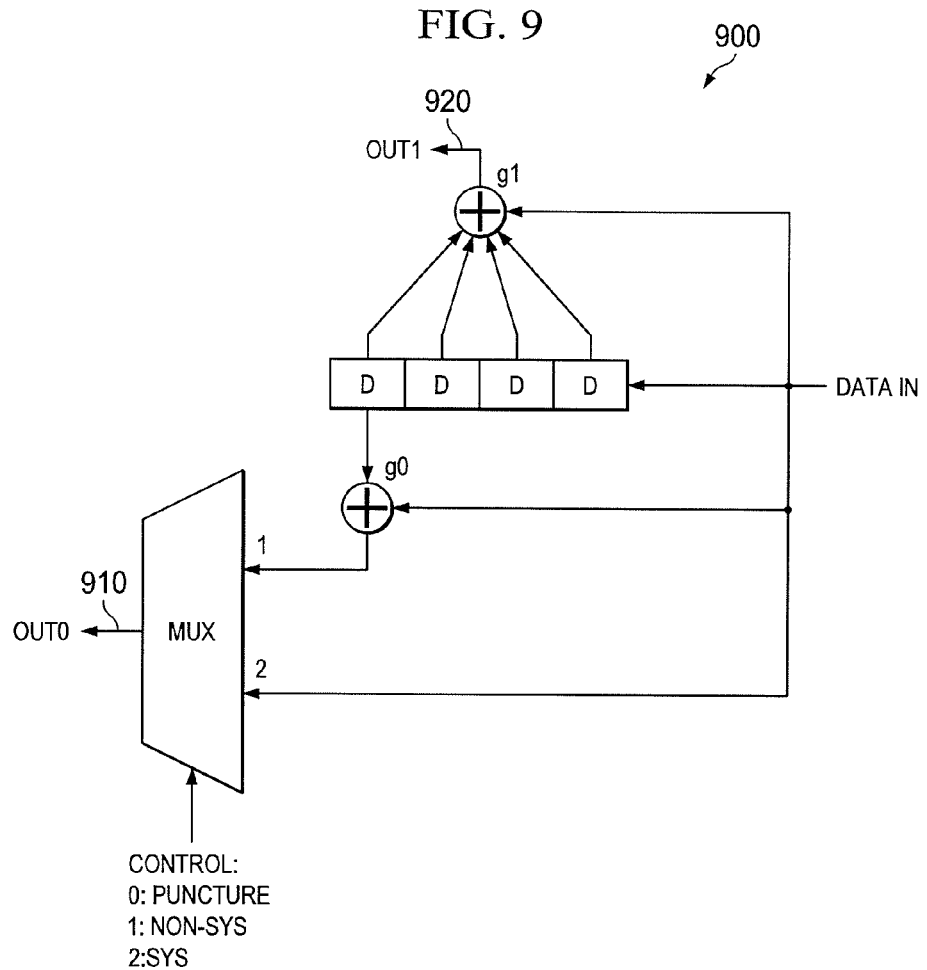

QC-LDPC CONVOLUTIONAL CODES ENABLING LOW POWER TRELLIS-BASED DECODERS

CROSS-REFERENCE TO RELATED APPLICATIONS AND CLAIM OF PRIORITY

The present application claims priority to U.S. Provisional Patent Application Ser. No. 61/759,874, filed Feb. 1, 2013, entitled "QC-LDPC CONVOLUTIONAL CODES ENABLING LOW POWER TRELLIS-BASED DECODERS" and U.S. Provisional Patent Application Ser. No. 61/846,391, filed Jul. 15, 2013, entitled "QC-LDPC CONVOLUTIONAL CODES ENABLING LOW POWER TRELLIS-BASED DECODERS." The content of the above-identified patent documents is incorporated herein by reference.

TECHNICAL FIELD

The present application relates generally to encoding and decoding devices and, more particularly, to a method and apparatus of QC-LDPC convolutional coding enabling a low-power trellis-based encoder and decoder.

BACKGROUND

Low Density Parity Check (LDPC) codes that were introduced in the nineteen-sixties have received a great deal of attention in recent years for an ability to achieve performance close to the Shannon limit Additionally, the structure of LDPC codes is suitable for fast and efficient parallel decoding. Consequently, currently active telecommunication standards, such as IEEE 802.16e, WiGig, IEEE 802.15.3c, and DVB-S2, utilize LDPC block codes in their physical layer error control coding scheme.

In wireless communication systems, the baseband modem power consumption is significantly affected by the channel decoder complexity, especially when LDPC codes are used. The LDPC codes that are used in commercial standards are block codes, which means that the LDPC encodes each non-overlapping block of bits independently. The block size affects the code error rate as well as the processing latency. Increasing the block size, leads to a decrease in the bit-error-rate (BER) of the code. A larger block size also increases the latency because block codes are non-instantaneous and fragments of the encoded and decoded block cannot be output before completely processing all the bits in the block. In many wireless standards multiple block sizes are defined to provide flexibility to satisfy different application latency and error rate requirements. However, the plurality of block sizes, in certain standards, increases the encoding and decoding complexity of LDPC block code in hardware (HW), leading to an increase in the overall power consumption of the baseband modem for a given Signal-to-Noise Ratio (SNR), BER, and data rate. The most common LDPC block decoding techniques currently used such as Belief Propagation (BP) are iterative-based which requires multiple decoding iterations (i.e., 8 or 16 iterations) to correctly decode the bits at a low SNR. The overall LDPC decoder HW complexity increases linearly with iterations, while also reducing the SNR required to satisfy the desired BER. In addition, the matrix-based structure of the LDPC block codes causes any attempt to increase the LDPC block decoder processing rate by using a technique such as pipelining will result in no decrease or even to increase of the overall LDPC code power consumption as a result of the extra registers that are required. Time-varying LDPC convolutional codes are introduced by A. Jiménez Feltström and K. S. Zigangirov, in "Time-varying periodic convolutional codes with low-density parity-check matrix," IEEE Transactions on IT, vol. IT-45, no. 6, pp. 2181-2191, September 1999 (hereinafter "REF9") and enhanced by A. E. Pusane, R. Smarandache, P. O. Vontobel, D. J. Costello, Jr., in "Deriving Good LDPC Convolutional Codes from LDPC Block Codes," IEEE Transactions on IT, Vol. 57, No. 2, pp. 835-857, February 2011 (hereinafter "REF22") to offer lower BER performance. However, the LDPC convolutional codes still require iterative belief-propagation based (BP-based) decoding that results in large latency, high hardware complexity and power consumption.

SUMMARY

A method for increasing constraint length in low-density parity check (LDPC) encoding is provided. The LDPC encoding method includes determining a LDPC code block H-matrix including a systematic submatrix ($H_{sys}$) of input systematic data and a parity check submatrix ($H_{par}$) of parity check bits. The method includes diagonalizing the parity check submatrix ($H_{par}$). The method includes identifying a set of rows of the H-matrix that form a complete set of the input systematic data. The method includes selecting an input bit granularity ($\gamma$) and encoding latency. The method further includes obtaining a quasi-cyclic LDPC (QC-LDPC) convolutional code H-Matrix. Further, the method includes combining the set of rows into a single row with an increased constraints length A.

A QC-LDPC convolutional encoder is provided. The QC-LDPC convolutional encoder includes a convolutional encoder configured to determine a LDPC code block H-matrix including a systematic submatrix ($H_{sys}$) of input systematic data and a parity check submatrix ($H_{par}$) of parity check bits. The convolutional encoder is further configured to diagonalize the parity check submatrix ($H_{par}$). The convolutional encoder is further configured identify a set of rows of the H-matrix that form a complete set of the input systematic data. The convolutional encoder is configured to select an input bit granularity ($\gamma$) and encoding latency. The convolutional encoder is configured obtain a quasi-cyclic LDPC (QC-LDPC) convolutional code H-Matrix. Also, the convolutional encoder is configured combine the set of rows into a single row with an increased constraints length $\lambda$.

A quasi-cyclic low-density parity check (QC-LDPC) convolutional Viterbi decoder is provided. The QC-LDPC convolutional Viterbi decoder includes a Viterbi decoder configured to receive a QC-LDPC convolutional code block from a QC-LDPC convolutional encoder and decode the QC-LDPC convolutional code block in one iteration. The QC-LDPC convolutional encoder includes a convolutional encoder configured to determine a LDPC code block H-matrix including a systematic submatrix ($H_{sys}$) of input systematic data and a parity check submatrix ($H_{par}$) of parity check bits. The convolutional encoder is further configured to diagonalize the parity check submatrix ($H_{par}$). The convolutional encoder is further configured identify a set of rows of the H-matrix that form a complete set of the input systematic data. The convolutional encoder is configured to select an input bit granularity ($\gamma$) and encoding latency. The convolutional encoder is configured obtain a quasi-cyclic LDPC (QC-LDPC) convolutional code H-Matrix. Also, the convolutional encoder is configured combine the set of rows into a single row with an increased constraints length $\lambda$.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3 illustrates a parity check H-matrix associated with an LDPC encoding scheme according to embodiments of the present disclosure;

FIG. 9 illustrates a QC-LDPC Equivalent Single-Row Convolutional Encoder according to embodiments of the present disclosure;

DETAILED DESCRIPTION

Figure 1:
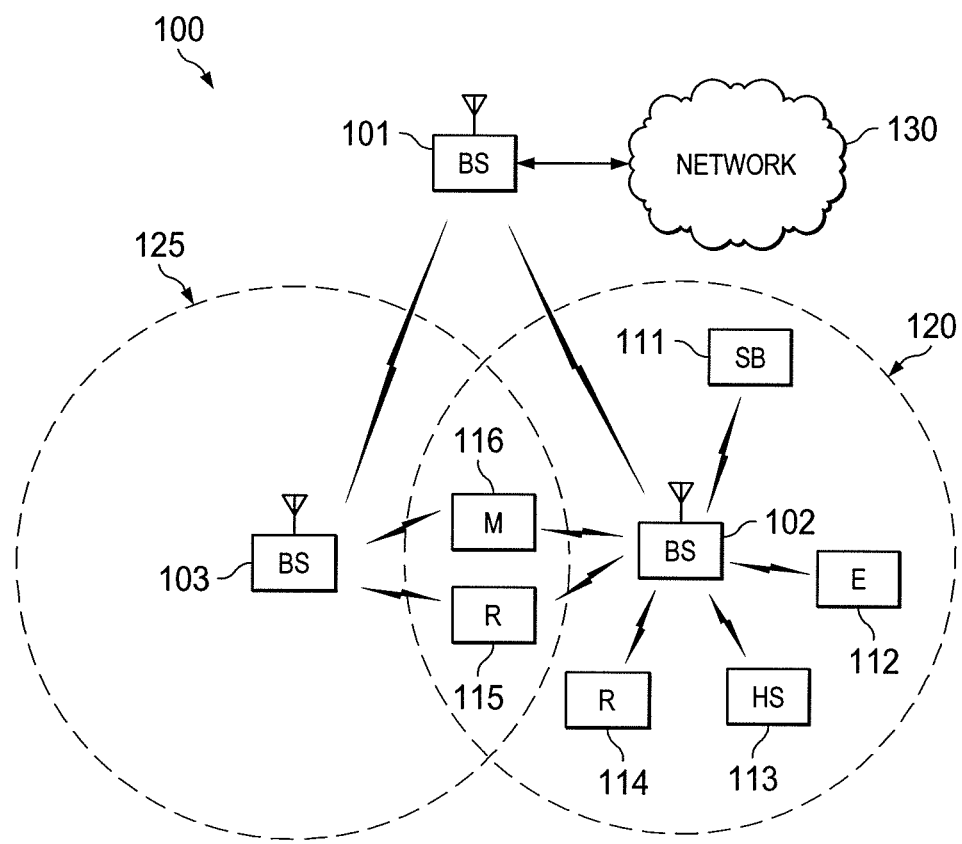
FIG. 1 illustrates a wireless network that performs LDPC encoding and decoding according to the embodiments of the present disclosure.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication device or system.

The following documents and standards descriptions are hereby incorporated into the present disclosure as if fully set forth herein: (i) R. G. Gallager, Low-density parity-check codes. Cambridge, Mass.: MIT Press, 1963 (hereinafter "REF1"); (ii) D. J. C. MacKay and R. M. Neal, "Near Shannon limit performance of low density parity check codes," Electronics Letters, vol. 32, pp. 1645-1646, August 1996 (hereinafter "REF2"); (iii) E. Boutillon, J. Castura, and F. R. Kschischang, "Decoder-first code design," Proceedings of the 2nd Intl Symposium on Turbo Codes and Related Topics, pp. 459-462, Brest, France, September 2000 (hereinafter "REF3"); (iv) T. Zhang, K. K. Parhi, "VLSI implementation-oriented (3,k)-regular low-density parity-check codes," 2001 IEEE Workshop on Signal Processing Systems, pp. 25-36, September 2001 (hereinafter "REF4"); (v) IEEE 802.16e-2005 Specification, February 2006 (hereinafter "REF5"); (vi) WiGig MAC and PHY Specification v1.0, April 2010 (hereinafter "REF6"); (vii) IEEE 802.15.3c-2009 Specifications, October 2009 (hereinafter "REF7"); (viii) DVB-S2 Specification, ETSI EN 302 307 V1.2.1, August 2009 (hereinafter "REF8"); (ix) A. Jiménez Feltström and K. S. Zigangirov, "Time-varying periodic convolutional codes with low-density parity-check matrix," IEEE Transactions on IT, vol. IT-45, no. 6, pp. 2181-2191, September 1999 (hereinafter "REF9"); (x) 3GPP LTE Release 8 TSG RAN WG1, http://www.3gpp.org/RAN1-Radio-layer-1 (hereinafter "REF10"); (xi) J. Thorpe, "Low-density parity-check (LDPC) codes constructed from protographs," Tech. Rep. 42-154, IPN Progress Report, August 2003 (hereinafter "REF11"); (xii) D. Divsalar, S. Dolinar, and C. Jones, "Protograph LDPC codes over burst erasure channels," IEEE Military Commun. Conf., 2006 (hereinafter "REF 12"); (xiii) P. Elias, "Coding for noisy channels," IRE Transactions on Information Theory, pp. 37-46, 1955. Also in Key Papers in Development of Coding Theory, IEEE Press, New York, N.Y., 1974 (hereinafter "REF13"); (xiv) E. Pisek, D. Rajan, J. Cleveland, "Gigabit rate low power LDPC decoder," ITW 2011, pp. 518-522, October 2011 (hereinafter "REF14"); (xv) R. M. Tanner, "A recursive approach to low complexity codes," IEEE Transactions on IT, vol. 27, pp. 533-547, September 1981 (hereinafter "REF15"); (xvi) A. J. Viterbi, "Error bounds for convolutional codes and an asymptotically optimum decoding algorithm," IEEE Transactions on IT, vol. 13, pp. 260-269, April 1967 (hereinafter "REF16"); (xvii) G. D. Formey, "The Viterbi algorithm," Proceedings of the IEEE, vol. 61, pp. 268-278, March 1973 (hereinafter "REF17"); (xviii) S. Lin and D. J. Costello, Jr., Error Control Coding: Fundamentals and Applications. Englewood Cliffs, N.J.: Prentice-Hall, 2nd ed., 2004 (hereinafter "REF18"); (xix) R. M. Tanner, D. Sridhara, A. Sridharan, T. E. Fuja, D. J. Costello, Jr., "LDPC Block and Convolutional Codes Based on Circulant Matrices," IEEE Transactions on IT, Vol. 50, No. 12, pp. 2966-2984, December 2004 (hereinafter "REF 19"); (xx) A. E. Pusane, A. Jiménez Feltström, A. Sridharan, M. Lentimaier, K. S. Zigangirov, and D. J. Costello, Jr., "Implementation Aspects of LDPC convolutional Codes," IEEE Transactions on Commun., vol. 56, no. 7, pp. 1060-1069, July 2008 (hereinafter "REF20"); (xxi) D. G. M. Mitchell, M. Lentmaier, D. J. Costello, Jr. "New families of LDPC block codes formed by terminating irregular protograph-based LDPC convolutional codes," ISIT 2010, pp. 824-828, June 2010 (hereinafter "REF21"); (xxii) A. E. Pusane, R. Smarandache, P. O. Vontobel, D. J. Costello, Jr., "Deriving Good LDPC Convolutional Codes from LDPC Block Codes," IEEE Transactions on IT, Vol. 57, No. 2, pp. 835-857, February 2011 (hereinafter "REF22"); (xxiii) M. Fossorier, M. Mihaljevic and H. Imai, "Reduced complexity iterative decoding of low-density parity check codes based on belief propagation," IEEE Transactions on Commun., vol. 47, pp. 673-680, May 1999 (hereinafter "REF23"); (xxiv) J. Chen and M. Fossorier, "Near optimum universal belief propagation based decoding of low-density parity-check codes," IEEE Transactions on Commun., vol. 50, pp. 406-414, March 2002 (hereinafter "REF24"); (xxv) Xiao-Yu Hu; Eleftheriou, E.; Arnold, D. M., "Regular and irregular progressive edge-growth tanner graphs," IEEE Transactions on IT, vol. 51, no. 1, pp. 386-398, January 2005 (hereinafter "REF25"); (xxvi) Vukobratovic, D.; Senk, V., "Generalized ACE Constrained Progressive Edge-Growth LDPC Code Design," IEEE Communications Letters, vol. 12, no. 1, pp. 32-34, January 2008 (hereinafter "REF26"); and (xxvii) R. M. Tanner, "Error-correcting coding system," U.S. Pat. No. 4,295,218 (hereinafter "REF27").

This disclosure provides a set of Quasi-Cyclic (QC)-LDPC convolutional codes, which provide a wide range of trade-offs between complexity (encoding and decoding), error-rate performance, and granularity (equivalently data processing latency). The QC-LDPC convolutional code of the present disclosure is derived from a QC-LDPC block code by inheriting the LDPC block code parameters that determine the performance of the code. While preserving the block structure, the QC-LDPC convolutional code provides higher flexibility in block granularity. Unlike other LDPC convolutional codes, the QC-LDPC convolutional code can be implemented by a low latency Trellis-based decoder. This disclosure provides related encoding methods that provide higher data rate by increasing the derived QC-LDPC convolutional code rate. The data rate is the amount of a stream that is the payload or data, not parity or redundancy. The QC-LDPC convolutional codes according to this disclosure provide finer bit granularity than traditional LDPC block codes and lower complexity and latency than existing LDPC convolutional codes. See REF9, REF19, and REF22. A comparison between the proposed QC-LDPC convolutional code with the related Trellis-based decoder and a QC-LDPC block code with existing iterative decoders shows that the QC-LDPC convolutional code with the related Trellis-based channel decoder enables low power low latency solution with more than 4 times finer block granularity than the LDPC block code while achieving more than 4 dB lower Signal-to-Noise Ratio (SNR) for the same hardware complexity and bit-error-rate (BER), or more than 6 times lower hardware complexity with same SNR and BER than the block code, enabling low power high data rate mobile baseband modems.

According to embodiments of the present disclosure, a multi-row encoding technique increases the code rate and increases the constraint length and consequently reduces the BER. This technique is essentially an efficient way to puncture the code by leveraging the dependencies in the existing base code. The multi-row technique can be applied to a large class of QC-LDPC convolutional codes.

The structure of the QC-LDPC convolutional codes is leveraged to derive a low complexity, non-iterative Trellis-based decoder (for example, a QC-Viterbi decoder). To the best of our knowledge, this is the first non-iterative decoder for LDPC codes that can be applied for low power high data rate systems.

The present disclosure quantifies the trade-off between the decoder hardware complexity, which is measured by the number of gates multiplied by the number of stages required for the decoder, and the received SNR required to achieve a desired BER for a given data rate. Numerical results show that the QC-LDPC convolutional code with the related QC-Viterbi decoder requires 4 dB lower SNR than conventional LDPC block codes for the same hardware complexity and BER using a constraint length of 10. Equivalently, the QC-LDPC code requires 6 times lower hardware complexity with same SNR and BER than conventional LDPC block codes.

FIG. 1 illustrates a wireless network 100 that performs an LDPC encoding and decoding process according to the embodiments of the present disclosure. The embodiment of the wireless network 100 shown in FIG. 1 is for illustration only. Other embodiments could be used without departing from the scope of this disclosure.

The wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of mobile stations within coverage area 120 of base station 102. The first plurality of mobile stations includes mobile station 111, which can be located in a small business (SB), mobile station 112, which can be located in an enterprise (E), mobile station 113, which can be located in a WiFi hotspot (HS), mobile station 114, which can be located in a first residence (R), mobile station 115, which can be located in a second residence (R), and mobile station 116, which can be a mobile device (M), such as a cell phone, a wireless laptop, a wireless PDA, or the like.

Base station 103 provides wireless broadband access (via base station 101) to Internet 130 to a second plurality of mobile stations within coverage area 125 of base station 103. The second plurality of mobile stations includes mobile station 115 and mobile station 116. As an example, base stations 101-103 communicate with each other and with mobile stations 111-116 using orthogonal frequency division multiple (OFDM) or orthogonal frequency division multiple access (OFDMA) techniques.

Base station 101 can be in communication with either a greater number or a lesser number of base stations. Furthermore, while only six mobile stations are depicted in FIG. 1, it is understood that wireless network 100 can provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and can be said to be operating in handoff mode, as known to those of skill in the art.

Mobile stations 111-116 access voice, data, video, video conferencing, and/or other broadband services via Internet 130. In an exemplary embodiment, one or more of mobile stations 111-116 is associated with an access point (AP) of a WiFi WLAN. Mobile station 116 can be any of a number of mobile devices, including a wireless-enabled laptop computer, personal data assistant, notebook, handheld device, or other wireless-enabled device. Mobile stations 114 and 115 can be, for example, a wireless-enabled personal computer (PC), a laptop computer, a gateway, or another device.

Figure 2A:
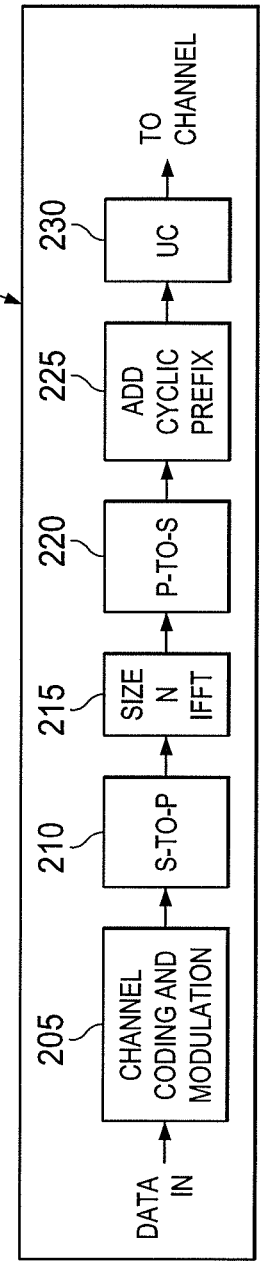
FIGS. 2A and 2B illustrate an orthogonal frequency division multiple access (OFDMA) transmit path and receive path, respectively, according to embodiments of the present disclosure.
Figure 2B:
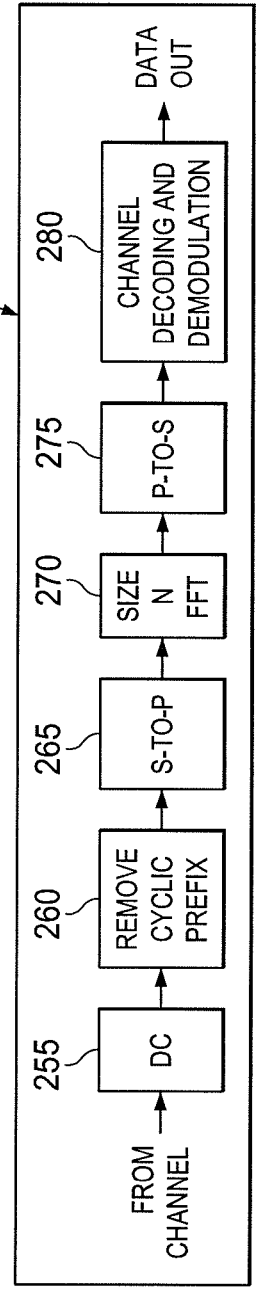

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in mobile station (MS) 116 for the purposes of illustration and explanation only. However, it will be understood by those skilled in the art that the OFDMA receive path also can be implemented in BS 102 and the OFDMA transmit path can be implemented in MS 116.

The transmit path in BS 102 includes channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in MS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B can be implemented in software while other components can be implemented by configurable hardware or a mixture of software and configurable hardware. In particular, it is noted that the FFT blocks and the IFFT blocks described in this disclosure document can be implemented as configurable software algorithms, where the value of Size N can be modified according to the implementation.

In BS 102, channel coding and modulation block 205 receives a set of information bits, applies LDPC coding and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and MS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal can also be filtered at baseband before conversion to RF frequency.

The transmitted RF signal arrives at MS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes (i.e., performs LDPC decoding) the modulated symbols to recover the original input data stream.

Each of base stations 101-103 implement a transmit path that is analogous to transmitting in the downlink to mobile stations 111-116 and implement a receive path that is analogous to receiving in the uplink from mobile stations 111-116. Similarly, each one of mobile stations 111-116 implement a transmit path corresponding to the architecture for transmitting in the uplink to base stations 101-103 and implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more context-based operation reconfigurable instruction set processors (CRISPs), such as the CRISP processor(s) described in one or more of application Ser. No. 11/123,313, filed May 6, 2005 and entitled "Context-Based Operation Reconfigurable Instruction Set Processor And Method Of Operation"; U.S. Pat. No. 7,769,912, filed Jun. 1, 2005 and entitled "Multi Standard SDR Architecture Using Context-Based Operation Reconfigurable Instruction Set Processors"; U.S. Pat. No. 7,483,933, issued Jan. 27, 2009 and entitled "Correlation Architecture For Use In Software-Defined Radio Systems"; application Ser. No. 11/225,479, filed Sep. 13, 2005 and entitled "Turbo Code Decoder Architecture For Use In Software-Defined Radio Systems"; and application Ser. No. 11/501,577, filed Aug. 9, 2006 and entitled "Multi-Code Correlation Architecture For Use In Software-Defined Radio Systems", all of which are hereby incorporated by reference into the present application as if fully set forth herein.

FIG. 3 illustrates a parity check H-matrix associated with a LDPC encoding scheme according to embodiments of the present disclosure. The embodiment of the H-matrix 300 shown in FIG. 3 is for illustration only. Other embodiments could be used without departing from the scope of this disclosure.

Figure 12:
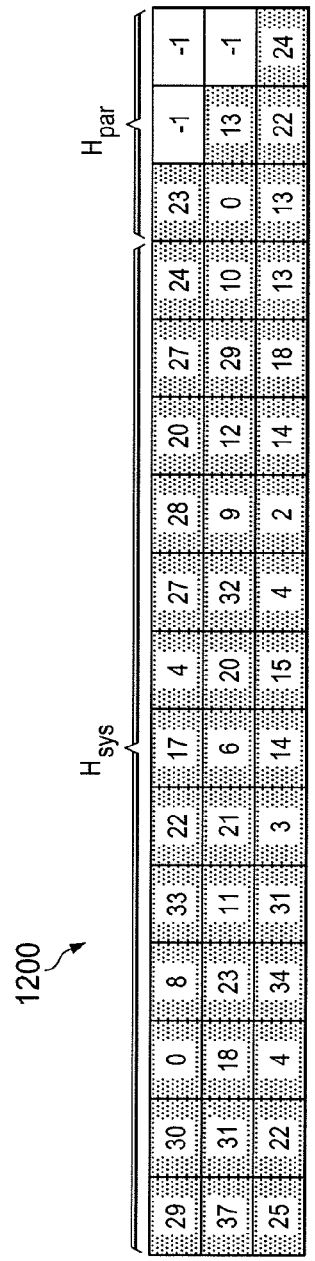
FIG. 12 illustrates another example of a WiGig H-Matrix according to embodiments of the present disclosure.

The H-matrix 300 as shown is a ½ code rate H-matrix conforming to the WiGig standard. In other embodiments, the H-matrix can have any suitable rate, such as a ⅝, ¾, or a 13/16 code rate (as shown in FIG. 12). Additionally, the H-matrix 300 shown has a block size (N) of 672 bits with a lifting factor (Z) of 42. Other embodiments of H-matrices for use with the present disclosure can have other block sizes and lifting (Z) factors.

As described above, LDPC Block codes that were introduced by Gallager in REF1 provide close to Shannon limit performance and are used in several wireless communication standards. However, the low error rates of LDPC block codes are obtained only at large block sizes (typically greater than 1000 bits). These large block sizes result in high latency, coarse granularity and low flexibility in terms of plurality of block sizes. For example, as described in REF6, WiGig has only a single block size. In comparison, Turbo codes provide a plurality of block sizes. For example, 3GPP/LTE/A in REF0 defines 188 blocks sizes between 40 and 6144 bits.

The QC-LDPC convolutional codes of the present disclosure are based on an underlying base LDPC block code. In this disclosure, without loss of generality, the IEEE802.11ad/ WiGig 672-bit, rate 1/2 LDPC block code of REF6 is used as a reference to describe and evaluate the embodiments of the present disclosure. A similar process can be used with other LDPC block codes as the basis.

The rate 1/2 H-matrix 300 is a 672×336 matrix that represents a transmission of 672 bits per frame (bpf). For example, see REF11 and REF12. In the H-matrix 300, a systematic sub-matrix $H_{sys}$ is composed of the first eight columns 302 that represent systematic (or data) bits; and a parity check sub-matrix $H_{par}$ is composed of the second eight columns 304 that represent parity (or redundancy) bits. The shaded boxes in FIG. 3 denote the protograph. The protograph, as described in REF 11 and REF 12, denotes the number of entries at each row and column in the H-Matrix. The entries are arranged in groups of Quasi-Cyclic bits called lifting factor Z. That is, each number in each H-Matrix entry denotes the Z-based cyclic shifts of the identity matrix of size Z-Factor-by-Z-Factor bits for each Z-group of input and parity bits. The Z-factor defines the number of bits per matrix. For example, the Z-Factor as shown is set to '42.' Each row in the H-matrix 300 forms a layer, which consists of '42' contention free check nodes, and can be processed in parallel without contention. An iteration (computing VN-to-CN messages, CN-to-VN messages, and updating VNs LLR values), in a layered decoder, consists of several sub-iterations, namely, one sub-iteration per layer, where all check nodes in the layer are updated in parallel. As such, using the H-matrix shown, each frame in the transmission includes 336 systematic bits and 336 parity bits. A '-1' value represents a zero matrix. Accordingly, the '-1' value indicates that the location is not used in the calculation. The remaining values (i.e., those having values other than '-1') are location values that represent a matrix.

Using the protograph the row entries and column entries (Variable Nodes—VNs) can be allocated for each parity check equation called a Check Node (CN). The (−1) in the H-Matrix shown in FIG. 3 denotes no VN connection to the related CN. The lower triangular parity check sub-matrix enables a back-substitution encoder that has lower complexity. Using the bit grouping (also referred to as "lifting factor") of 42 bits and quasi-cyclic shifts enables this compact representation of the H-matrix. This code is also called Quasi-Cyclic LDPC Block code or QC-LDPC block code because of the use of lifting factor in the code and applying cyclic shifts.

The systematic bits of the first row 306 of the systematic submatrix $H_{sys}$ 302 are summed together by an XOR function to calculate the corresponding first parity bit of $H_{par}$ 304 in column 0, row 0 of $H_{par}$. The systematic bits of subsequent rows of the $H_{sys}$ 302 are summed together by an XOR function to calculate the corresponding subsequent set of parity bits of $H_{par}$ 304. For example, the systematic bits of the third row 308 of the systematic submatrix $H_{sys}$ 302 are used to calculate the set of parity bits in columns 1-2, row 2 of $H_{par}$ 304.

Figure 4:
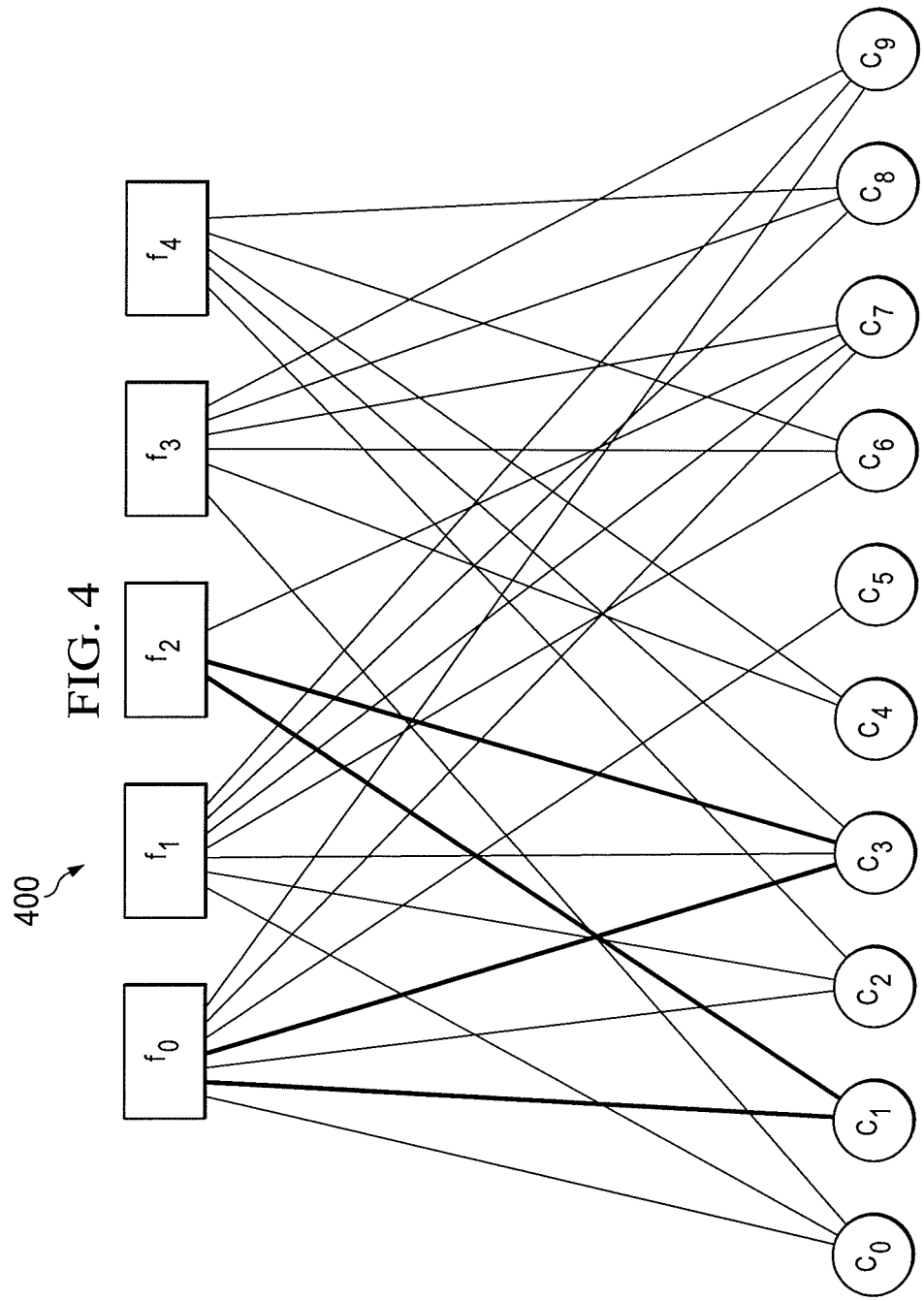
FIG. 4 illustrates a tanner graph that corresponds to a parity check matrix according to embodiments of the present disclosure.

FIG. 4 illustrates Tanner graph 400 that corresponds to a parity check matrix according to embodiments of the present disclosure. The embodiment of Tanner graph 400 shown in FIG. 4 is for illustration only. Other embodiments of Tanner graph 400 can be used without departing from the scope of this disclosure.

Tanner graph 400 is a bipartite graph. In bipartite graphs, nodes are separated into two distinctive sets and edges only connect nodes of two different types. The two types of nodes in Tanner graph 400 are referred to as variable nodes (hereafter, "v-nodes") and check nodes (hereafter, "c-nodes").

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

Tanner graph 400 corresponds to the parity check H-matrix illustrated by Equation 1. Tanner graph 400 includes five (5) c-nodes (the number of parity bits) and ten (10) v-nodes (the number of bits in a codeword). C-node fi is connected to v-node $c_j$ if the element $h_{ij}$ of H-matrix is a binary 1. For example, c-node f0 is connected $c_0$, $c_1$, $c_2$, $c_3$, $c_5$, $c_7$ and $c_9$. The connection between $f_0$ and $c_0$ corresponds to $h_{00}$; the connection between $f_0$ and $c_2$ corresponds to $h_{01}$; and so on.

Therefore, the connections to $f_0$ correspond to the first row in the H-matrix, further illustrated in Equation 1:

$$\vec{H}_0 = [1\ 1\ 1\ 1\ 0\ 1\ 0\ 1\ 0\ 1] \quad \text{[Eqn. 1]}$$

A degree of a node is the number of edges (e.g., connections) connected to the node.

Low Density Parity Check codes (LDPC) have recently received considerable attention in the error control coding field, due to the low complexity in implementation of decoding algorithms. Furthermore, this class of codes performs near the Shannon bound for relatively long block lengths. Among different families of decoding algorithms, the well-known belief propagation (BP) algorithm provides a good decoding performance. However, the BP algorithm often requires large hardware complexity. A simplified variation of BP algorithm, referred to as a min-sum decoding algorithm, reduces the hardware complexity, but often at the cost of performance degradation. Recently, a normalized min-sum decoding algorithm has been implemented in many practical and finite precision applications since it provides acceptable decoding performance as compared to BP algorithm for regular codes. However, for the most irregular LDPC codes, the normalized min-sum decoding algorithm can perform relatively poorly under finite precision implementation conditions.

According to the present disclosure, a regular LDPC code includes a same number of inputs as outputs; and an irregular LDPC code includes a different number of inputs as outputs. Most irregular LDPC codes typically have a large amount of low-degree variable nodes. These variable nodes require more numbers of iterations to converge as compared to high-degree variables nodes. Furthermore, finite precision decoding techniques further decreases the convergence rate of the low-degree variable nodes due to quantization effects. Various min-sum algorithms have been proposed to improve the decoding performance, but at the cost of slower convergence rate and higher hardware complexity. For instance, it has been proposed that the variable nodes can use down-scaled intrinsic information iteratively to improve the reliability of extrinsic information at the variable nodes. The down-scaling in intrinsic values, however, can reduce the convergence speed. Furthermore, the down scaling factor often needs to be optimized for a specific number of iterations.

REF13 describes convolutional codes as an alternative to block codes. Similar to LDPC block codes, the time-varying LDPC convolutional codes described in REF9, are convolutional codes defined by sparse parity-check matrices or equivalently sparse syndrome former matrices. A regular LDPC convolutional ($m_s$,J,K) code of REF9 is defined by a syndrome former matrix (namely, transposed parity check matrix) with memory $m_s$ and has exactly J ones in each row and K ones in each column. The rate, R, of the LDPC convolutional code is R=b/c, where b<c and where b and c can be any positive integer number. The syndrome former $H^T$ of a convolutional code becomes sparse by merely increasing one or both of (c−b) and $m_s$ because J<<(c−b)$m_s$. The syndrome former matrix $H^T$ has a structure represented by Equation 1:

$$H^T = \begin{bmatrix} H_0^T(0) & \ldots & H_{m_s}^T(m_s) & & \\ & H_0^T(t_1) & \ldots & H_{m_s}^T(t_1 + m_s) & \\ & & \ddots & & \ddots \\ & & H_0^T(t_2) & \ldots & H_{m_s}^T(t_2 + m_s) \\ & & & \ddots & & \ddots \end{bmatrix} \quad \text{[Eqn. 2]}$$

In Equation 1, the elements $H_i^T(t)$, i=0,1, ..., $m_s$ are binary c×(c−b) sub-matrices. As described above, a regular $H^T$ has J ones in each row and K ones in each column starting from the $m_s$ (c−b)-th column. The syndrome former memory $m_s$ is determined by the maximal number of the nonzero $H_i^T(t)$ sub-matrices in a single set of c rows of the matrix $H^T$, and the associated constraint length $v_s$ equals $(m_s+1)c$.

The Tanner graph of REF15 that corresponds to a convolutional LDPC code has an infinite number of nodes. However, the distance between two variable nodes that are connected to the same check node is limited by the syndrome former memory $m_s$. Since $m_s$ is finite, it allows continuous decoding using a bit-wise finite sliding window over the received sequence, similar to a Viterbi decoder with a bit-wise finite path memory. See REF16, REF17, and REF18. In addition, the bit-wise decoding of two variable nodes that are at least $(m_s+1)$ time units apart ($v_s$ bits apart) can be performed independently, since the corresponding bits cannot participate in the same parity-check equation.

In order to achieve near capacity performance, an LDPC convolutional code must have a large value of $m_s$. The LDPC convolutional codes in REF19 typically have large constraint lengths and therefore the use of trellis-based decoding algorithms is not feasible. As a result, Belief Propagation (BP) techniques are used to decode the convolutional code.

A pipelined architecture for LDPC convolutional decoding employs iterative processing in REF20. A method allows the parallelization of the I iterations by employing I independent and identical processors that simultaneously work on different regions of the Tanner graph. See REF21 and REF22. The parallelization has equivalent complexity as a single LDPC block decoder of size $N_b = v_s I$. As a result, the latency of the architectures described in REF21 and REF22 is proportional to $I^2$ for a given data rate.

According to embodiments of this disclosure, QC-LDPC convolutional codes support multi-bit granularity (γ). That is, QC-LDPC convolutional codes according to embodiments of this disclosure enable a single iteration decoder with high processing rate, low latency and power-efficient encoder/decoder architectures that supporting both BP and Trellis-based QC-Viterbi decoding.

A power efficient LDPC encoder and decoder include a carefully designed LDPC code (namely, the $H^T$ matrix). The criteria use in the design of the LDPC convolutional code to achieve low complexity (and low power consumption) decoder includes: (a) small $J \ll (c-b)m_s$ and $K \ll m_s c$ (sparse H-matrix); (b) reduced latency (single iteration decoder and small size $m_s$); (c) reduced complexity bit interleaving (grouping); (d) medium granularity $(1 \ll \gamma \ll (m_s+1)c)$; (e) simple encoding (lower triangular parity matrix); and (f) non-systematic code for better BER performance.

Figure 5:
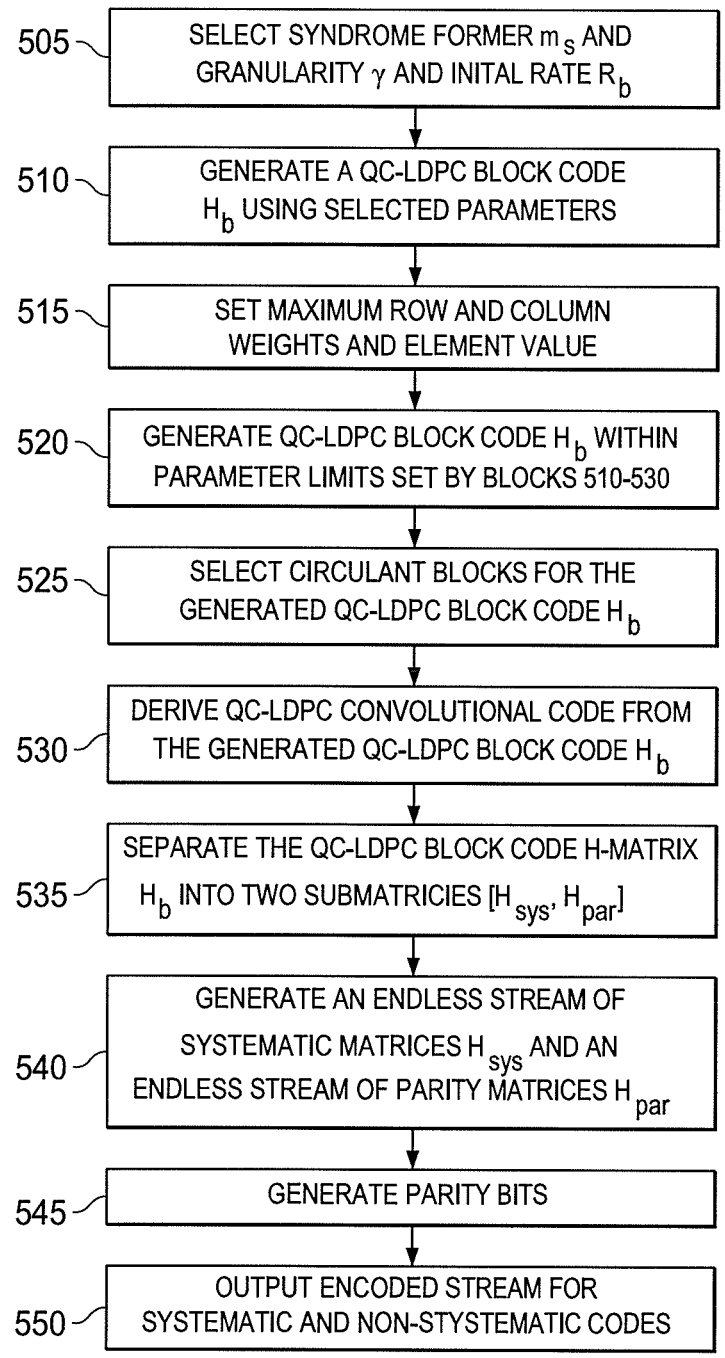
FIG. 5 illustrates a QC-LDPC Convolutional Code Construction method according to embodiments of the present disclosure.

FIG. 5 illustrates a QC-LDPC Convolutional Code Construction method according to embodiments of the present disclosure. That is, FIG. 5 illustrates a method implemented by a QC-LDPC convolutional encoder for designing a protograph-based QC-LDPC convolutional code family. The embodiment of the QC-LDPC Convolutional Code Construction process 500 shown in FIG. 5 is for illustration only. Other embodiments could be used without departing from the scope of this disclosure. The process 500 can be implemented by processing circuitry of an encoder or a computing system (referred to generally as "system").

In block 505, the system selects the desired syndrome former memory $m_s$ of the LDPC convolutional code based on channel conditions and capacity requirements. The syndrome former memory $m_s$ is selected proportionally to the number of channel taps. This disclosure uses an AWGN channel as an example, but other types of suitable channels may be used. Block 505 also includes selecting the desired LDPC convolutional code granularity (bit grouping circulant) γ=Z or γ=iZ (multiple of the bit grouping circulant), where $0 \le iZ \ll kZ$ and $kZ = m_s c$ and i, k are integers. In Block 505 includes selecting an initial rate $$R_b = \frac{b}{c}$$

for the corresponding LDPC code block.

In block 510, the system uses the parameters selected in block 505 to generate a corresponding QC-LDPC block code. That is, the LDPC block bit grouping circulant is set to Z, the lifting factor. The LDPC block size $N_b$ is defined by Equation 3, the parameter B is defied by Equation 4, the parameter C is defined by Equation 5:

$$N_b = \frac{m_s Z}{R_b} \quad \text{[Eqn. 3]}$$

$$B \equiv \frac{N_b R_b}{Z} \quad \text{[Eqn. 4]}$$

$$C \equiv \frac{N_b}{Z} \quad \text{[Eqn. 5]}$$

Accordingly, the initial rate $R_b$ can be expressed by Equation 6.

$$R_b = \frac{B}{C} \quad \text{[Eqn. 6]}$$

The system generates the corresponding LDPC block code H-Matrix $H_b$, with $$C - B = \frac{N_b}{Z}(1 - R_b)$$

number of Z-grouped rows, and C number of Z-grouped columns. The parity check matrix, $H_{par}$, is a lower triangular matrix to ensure low complexity encoding using the back substitution method as described in REF11.

In block 515, the system sets the maximum row weight $W_r$ and maximum column weight $W_c$. The system also sets the row weight for the systematic part only $W_{rs}$ to allow an efficient QC-Viterbi decoding. The system sets the maximum element value allowed in $H_b$. In the examples used in the present disclosure, only binary elements are used, hence maximum value is set to 1.

In block 520, the system uses the protograph-based EXIT analysis to design LDPC block code H-Matrix $H_b$, which satisfies the constraints set forth blocks 505-515 and achieves the lowest decoding threshold.

In block 525, the system selects proper circulant blocks using the progressive edge-growth (PEG) algorithm of REF25 (or any other suitable algorithm such as the approximate cycle extrinsic degree (ACE) algorithm of REF26). As a result, SNR/BER requirements are achieved and the LDPC block code H-Matrix $H_b$ for the block code is ascertained.

In block 530, the system derives the corresponding QC-LDPC convolutional code from the block code generated in blocks 505-525. The system expects that input information bits to the LDPC convolutional encoder are defined by Equation 7:

$$I(Z_n) = \text{InBits}(nZ:(n+1)Z-1) \quad \text{[Eqn. 7]}$$

where, $-\infty<n<\infty$, Z is the lifting factor, and n is the input incremental variable.

In block 535, the LDPC Block code H-Matrix $H_b$ is separated into two submatrices $[H_{sys}, H_{par}]$ where $H_{sys}$ contains the related H-matrix systematic part and $H_{par}$ contains the related H-Matrix parity part. (The notation: $H_b^T$ is the transpose of $H_b$). Any valid codeword satisfies the condition of Equation 8:

$$[1,P]H_b^T=[1,P][H_{sys},H_{par}]^T=0 \quad [\text{Eqn. 8}]$$

In block 540, the system concatenates $H_{sys}$ matrices to create an endless stream of matrices $[\ldots H_{sys} H_{sys} H_{sys} \ldots]$ to support the endless stream of input bits. In most applications, the input bits start at n=0, in these cases the concatenated $H_{sys}$ matrix start at state "0" or any other state known by the encoder and decoder. To further lower BER, the system adds a single Z-cyclic shift value for all $H_{sys}$ values to concatenate cyclic shifted versions of $H_{sys}$. Similarly, the system adds a single Z-cyclic shift value for the parity part $H_{par}$ to concatenate cyclic shifted versions of $H_{par}$. This process will, however, increase hardware complexity.

In block 545, the system generates the parity bits, $\hat{P}(Z_{n,m})$, at Z-group row m according to Equation 9 (over GF(2)):

$$\hat{P}(Z_{n,m})=P(Z_{n,m})H_{par}^T(m,m)=\Sigma_{j=0}^{LB}I(Z_{n+j})H_{sys}^T(m,(n+j)\bmod B)+\Sigma_{s=0}^{m-1}P(Z_{n,s})H_{par}^T(m,s) \quad [\text{Eqn. 9}]$$

where $0\le m\le C-B-1$ and L denotes the desired encoding latency in blocks. Given that $Z_{(n+LB)\bmod B}=Z_n$ the system first adds $I(Z_{n+LB})$ and $I(Z_n)$ sets of input bits prior to multiplying the product of the $I(Z_{n+LB})$ and $I(Z_n)$ sets of input bits by the related $H_{sys}^T(m, n \bmod B)$. The result is that Equation 9 can be rewritten as:

$$\hat{P}(Z_{n,m})=P(Z_{n,m})H_{par}^T(m,m)=(I(Z_{n+LB})+I(Z_n))H_{sys}^T(m, n \bmod B)+\Sigma_{j=1}^{LB-1}I(z_{n+j})H_{sys}^T(m,(n+j)\bmod B)+\Sigma_{s=0}^{m-1}P(Z_{n,s})H_{par}^T(m,s) \quad [\text{Eqn. 10}]$$

where $0\le m\le C-B-1$.

The representation of the parity bits, $\hat{P}(Z_{n,m})$ in Equation 10 facilitates QC-LDPC convolutional encoder hardware design. In addition, in non-systematic codes, non-systematic input information bits $I'(Z_{n+LB})$ (defined by Equation 11) can be used as the encoder output, as compared with systematic codes that use $I(Z_{n+LB})$ as the encoder output.

$$I'(Z_{n+LB})=I(Z_{n+LB})+I(Z_n) \quad [\text{Eqn. 11}]$$

Figure 6:
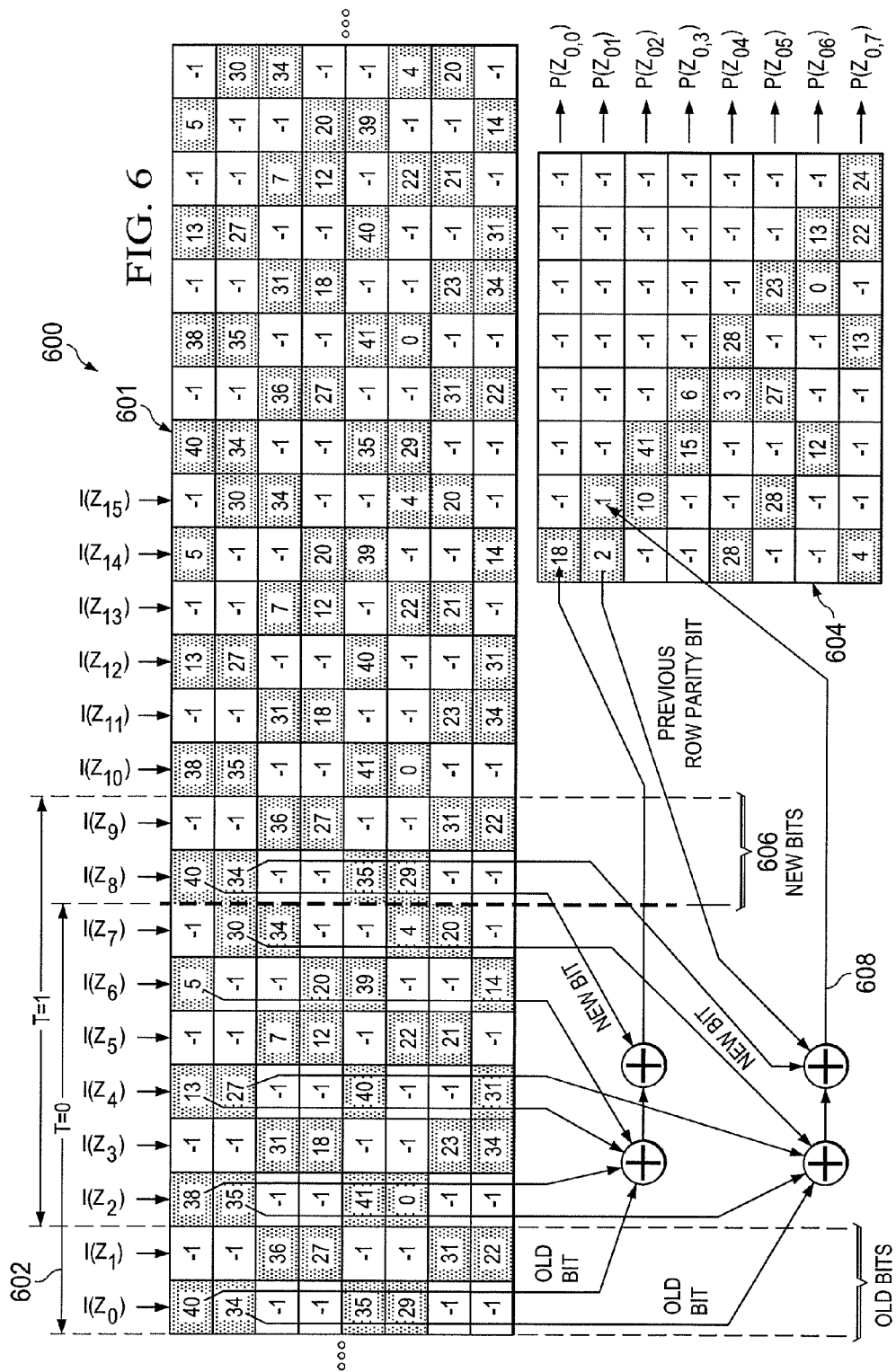
FIG. 6 illustrates an example process of generating a continuous H-matrix by implementing the QC-LDPC Convolutional Code Construction process according to embodiments of the present disclosure.

In block 550, the system transmits the final encoded stream for a systematic code at rate R=1/(C-B+1), for example when n=sLB, where s is integer $-\infty<s<\infty$. The output stream for the systematic code is given by the following series:

OutBits= ... $I(Z_n), P(Z_{n,0}), P(Z_{n,1}), P(Z_{n,2}), \ldots$
$P(Z_{n,C-B-1})$,
$I(Z_{n+1}), P(Z_{n+1,0}), P(Z_{n+1,1}), P(Z_{n+1,2}), \ldots$
$P(Z_{n+1,C-B-1}), \ldots$ Similarly also in block 550, the system transmits the final encoded stream for the non-systematic code. The output stream for the non-systematic code is given by the following series:

OutBits= ... $I'(Z_n), P(Z_{n,0}), P(Z_{n,1}), P(Z_{n,2}), P(Z_{n,C-B-1})$,
$I'(Z_{n+1}), P(Z_{n+1,0}), P(Z_{n+1,1}), P(Z_{n+1,2}), \ldots$
$P(Z_{n+1,C-B-1}), \ldots$ For streams that start at n=0, the beginning of the stream starts at state "0" in the convolutional codes, for example when $(Z_i)=\bar{0}$, for all i<0. Note that for concatenating $H_{sys}$ to create the LDPC convolutional code, the input stream can start at any point in the created convolutional code matrix (concatenated $H_{sys}$, within the code granularity $\gamma$, i.e., $\gamma=2Z$). For $\gamma=2Z$ granularity, the transmitted signal stream at $$R=1\Big/\left(\frac{C-B}{2}+1\right)$$

can be output as (non-systematic code, for example):

OutBits= ... $I'(Z_n), I'(Z_{n+1}), P(Z_{n,0}), P(Z_{n,1}), P(Z_{n,2}), \ldots$
$P(Z_{n,C-B-1})$,
$I'(Z_{n+2}), I'(Z_{n+3}), P(Z_{n+2,0}), P(Z_{n+2,1}), P(Z_{n+2,2}), \ldots$
$P(Z_{n+2,C-B-1}), \ldots$ FIG. 6 illustrates an example process 600 of generating a continuous H-matrix 601 by implementing the QC-LDPC Convolutional Code Construction process 500 according to embodiments of the present disclosure. The embodiment of the process 600 shown in FIG. 6 is for illustration only. Other embodiments of a continuous encoding process 600 can be used without departing from the scope of this disclosure. Additionally, in the particular embodiment shown, the continuous H-matrix 601 is generated from a matrix 300 that has a rate R=1/2 and a LDPC block code size of $N_b$=672-bits as shown in FIG. 3 and specified in the WiGig standard REF6. In other embodiments, however, any suitable rate H-matrix can be used.

As described above in reference to FIG. 3, the entries are arranged in groups of Quasi-Cyclic bits called lifting factor Z. In WiGig REF6 LDPC code, the lifting factor is fixed and equals Z=42, which yields $$B \equiv \frac{N_b R_b}{Z} = 8 \text{ and } C \equiv \frac{N_b}{Z} = 16.$$

As shown in FIG. 3, that the row weight $w_r$ is 8 and the column weight $w_c$ is 4. However, the systematic submatrix 302 of the code 300 (the left half of the H-Matrix in FIG. 3), contains only 4 non-zero entries and hence the effective row weight, $W_r$ ($W_{rs}$), is 4.

Like the H-matrix 300 of FIG. 3, the continuous H-matrix 601 is encoded by separately processing a systematic submatrix 602 of the continuous H-matrix 601 relative to a parity check portion 604 of the H-matrix. For example, in the present case in which the continuous H-matrix has a rate R=1/2, such that the continuous H-matrix 601 can be divided in half because the parity check submatrix 604 is similar in size to the systematic submatrix 602. Next, the systematic submatrix 602 is repeatedly processed to create a continuous systematic flow. That is, the systematic submatrix 602 is concatenated into successive, recurring systematic blocks that are separated by a specified symbol interval and individually processed by processors within a QC-LDPC convolutional encoder. Additionally, the parity check submatrix 604 is repeated accordingly for every Z-group systematic bits.

More particularly, the systematic submatrix 602 is separated from the parity submatrix 604 of the H-Matrix 601. For a rate 1/2 code, this separation is achieved by cutting the H-Matrix vertically in half. Then, the systematic submatrix 602 (left half) is repeated to create the semi-infinite systematic flow, and the parity part (right half) is repeated accordingly for every iZ-group of systematic bits.

The systematic submatrix 602 is encoded as a parallel convolutional code horizontally with k×Z group of bits k∈(1, 2, ...) entered at time t=nT, replacing the corresponding k×Z group of bits entered at time $$t = nT - \frac{LN_b R_b T}{(2Z)}$$

where $N_b$ is the block code size, $R_b$ is the block code rate and Z is the lifting factor. In the particular example shown in FIG. 6, i=2. In general, i represents the bit group to be inputted to the encoder each input phase. The systematic submatrix 602 is encoded as a parallel convolutional code horizontally with 2Z-group of new bits 606 at time t=nT replacing the corresponding 2Z-group of bits that entered at time=nT−$LN_b R_b T/(2Z)$. The parity bits 608 are added every T time units.

The convolutional code generated by implementing the QC-LDPC Convolutional Code Construction process 500 has the following parameters derived from the original block code:

Syndrome Former Memory: $m_s = \frac{LN_b R_b}{Z}$ [Eqn. 12]

Row and Column Weight: $K = W_{rs}, J = W_c$ [Eqn. 13]

Rate: $R = \frac{1}{\frac{C-B}{2}+1}$ for $\gamma = 2Z$ [Eqn. 14]

Equations 12-14 show that the transformation, from the block code parameters to the corresponding convolutional code parameters is complete and well defined. The syndrome former memory $m_s$ from $N_b$, $R_b$, and Z of the convolutional code is derived from the block code. An important difference between the block code and the derived convolutional code is the rate. In the WiGig LDPC H-Matirx example described in reference to FIG. 3, the block code rate $R_b$=1/2 while the derived convolutional code rate for a granularity of γ=2Z=84 is R=1/5. By comparison to the binary convolutional code in REF13, the equivalent constraint length of the LDPC convolutional code of FIG. 6, is λ=LK+1=5 (L=1). Unlike the LDPC convolutional codes introduced in REF9, the QC-LDPC convolutional code of the present disclosure with λ=5 makes it feasible to use Trellis-based decoders. Similar to shifting the bits in the other convolutional encoders, there are Z-shifts in the LDPC convolutional encoder and decoder. However, the LDPC convolutional encoder according to embodiments of the present disclosure uses a sliding window with sliding polynomials method, which can be treated as a circular buffer with circular polynomials method. The size of the window or the circular buffer is the size of the encoder memory (namely, the constraint length −1). The QC-LDPC convolutional encoder does not use shift registers because the Quasi-Cyclic (QC) shifts are performed in each Z-group of systematic bits. Trying to shift the bits in each row-encoder will result in misplaced bits. According to the present disclosure, the bits are QC back shifted before each Z-shift. However, QC back shifting the bits every stage results in using redundant power consumption. Consequently, the decoder of the present disclosure is also QC-based (i.e., BP, QC-Viterbi). Further code rate increase can be easily achieved by puncturing either the systematic or the parity bits (or both) of the encoded codeword. Code rate increases are furthered described below in reference to FIG. 7A.

Embodiments of the present disclosure include methods to increase the QC-LDPC convolutional code rate. The code rate $$R = 1 \Big/ \left(\frac{C-B}{2}+1\right)$$

(for example, R=1/5) of the present disclosure is lower than the LDPC block code rate $R_b$=B/C (i.e. $R_b$=1/2). Puncturing methods increase the code rate to R=1/2, which means that for every γ=2Z input bits the encoder will output 2Z parity bits, as compared with the 8Z parity bits generated by an encoder with a code rate of R=1/5.

Figure 7A:
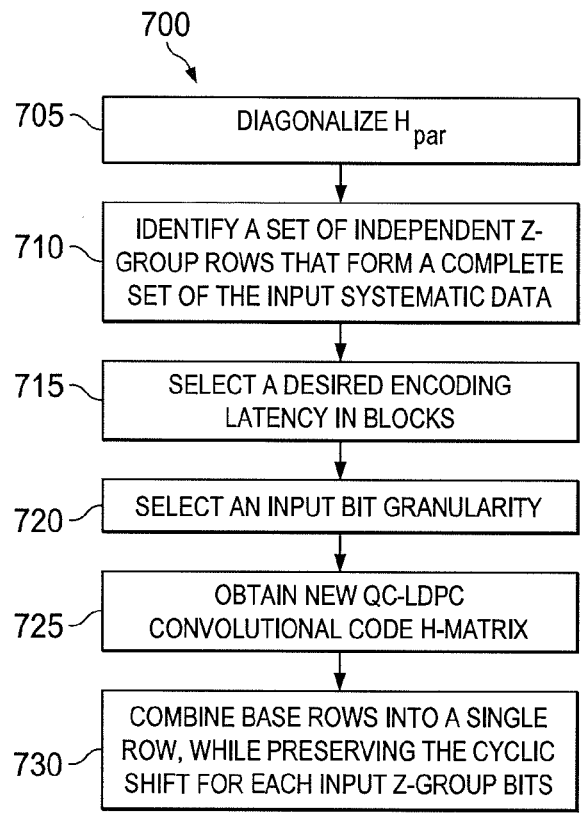
FIGS. 7A and 7B illustrate a Convolutional Encoding Method to generate the convolutional encoding outputs according to embodiments of the present disclosure.
Figure 7B:
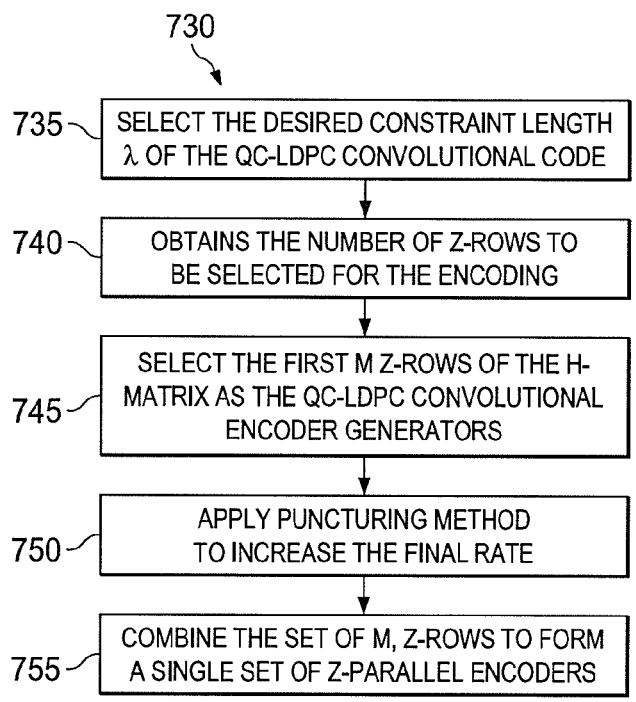

FIGS. 7A and 7B illustrate a Convolutional Encoding Method 700 to generate the convolutional encoding outputs according to embodiments of the present disclosure. The embodiment of the Convolutional Encoding Method 700 shown in FIG. 7A is for illustration only. Other embodiments could be used without departing from the scope of this disclosure. The process 700 can be implemented by processing circuitry of a QC-LDPC convolutional encoder or a computing system (referred to generally as "system").

The QC-LDPC convolutional encoding method 600 described in reference to FIG. 6 can be treated as a linear combination of $N_b$ (1−$R_b$) convolutional encoders. Each convolutional encoder processes a single row in the H-Matrix. Each row convolutional encoder has constraint length λ=LK+1 (for example, a constraint length of λ=5 for an encoding latency of L=1 and a row and column wright of K=4). Also, each row convolutional encoder preserves the original code rate $R_b$=B/C (i.e., with equivalent non-systematic polynomials $[g_0 \, g_1]$=[21 37] for λ=5 per row encoder). Puncturing the QC-LDPC convolutional code implies enabling only a portion of the row convolutional encoders to generate the QC-LDPC convolutional encoder outputs. However, since the parity matrix $H_{par}$ is a lower triangular matrix, each row convolutional encoder outputs can be dependent on one or more upper row encoder outputs. Disabling one or more upper rows will exclude using any lower row that is dependent on the disabled upper rows. As a result, modifying $H_{par}$ to be a diagonal matrix eliminates the dependency between the row encoders and allows the usage of any row in the H-Matrix independently. Diagonal $H_{par}$ allows any combination of rows to generate the required code rate as implemented in the Single-Row Convolutional Encoding Method.

In FIG. 7A, the QC-LDPC convolutional encoder diagonalizes the parity check submatrix $H_{par}$ by disabling all non-diagonal $H_{par}$ elements in block 725.

In block 710, the QC-LDPC convolutional encoder identifies a set (also referred to as a base) of independent Z-group rows that form a complete set of the input systematic data. Each input systematic bit is used by exactly one row convolutional encoder. The selected base of Z-group rows guarantees the preservation of the original LDPC block code rate by the QC-LDPC convolutional code R=$R_b$=B/C. If multiple row sets can be used as a base, then hopping between these sets will improve BER performance in certain channel models. If a base cannot be identified, then the system selects a set of rows that forms a complete set with minimum row dependency. As an example, let be the number of times Z-group i input bits is used in the set for 1≤i≤B. Then, the new derived code rate is represented by Equation 15:

$R = B^2 / ((\Sigma_{i=1}^{B} Y_i) C)$ [Eqn. 15]

In block 715, the QC-LDPC convolutional encoder selects the encoding latency L in blocks. The QC-LDPC convolutional code constraint length is λ=LK+1.

In block 720, QC-LDPC convolutional encoder selects the input bit granularity γ=MZ. The M represents the number of Z-group rows (Z-rows) used for the encoder set. Also in block 720, the QC-LDPC convolutional encoder verifies that the cyclic shifts of the first γ bits equal the cyclic shifts of the last γ bits.

In block 725, QC-LDPC convolutional encoder obtains the new QC-LDPC convolutional code H-Matrix based on the rows selected in block 725, with constraint length A and input granularity γ as selected in blocks 710 and 715 respectively.

In block 730, in cases where the derived H-Matrix is also a base (independent rows), all the base rows can be combined into a single row while preserving the cyclic shift for each input Z-group bits. The new constraint length is $\lambda=MLK+1$ with $\gamma=Z$.

Figure 8A:
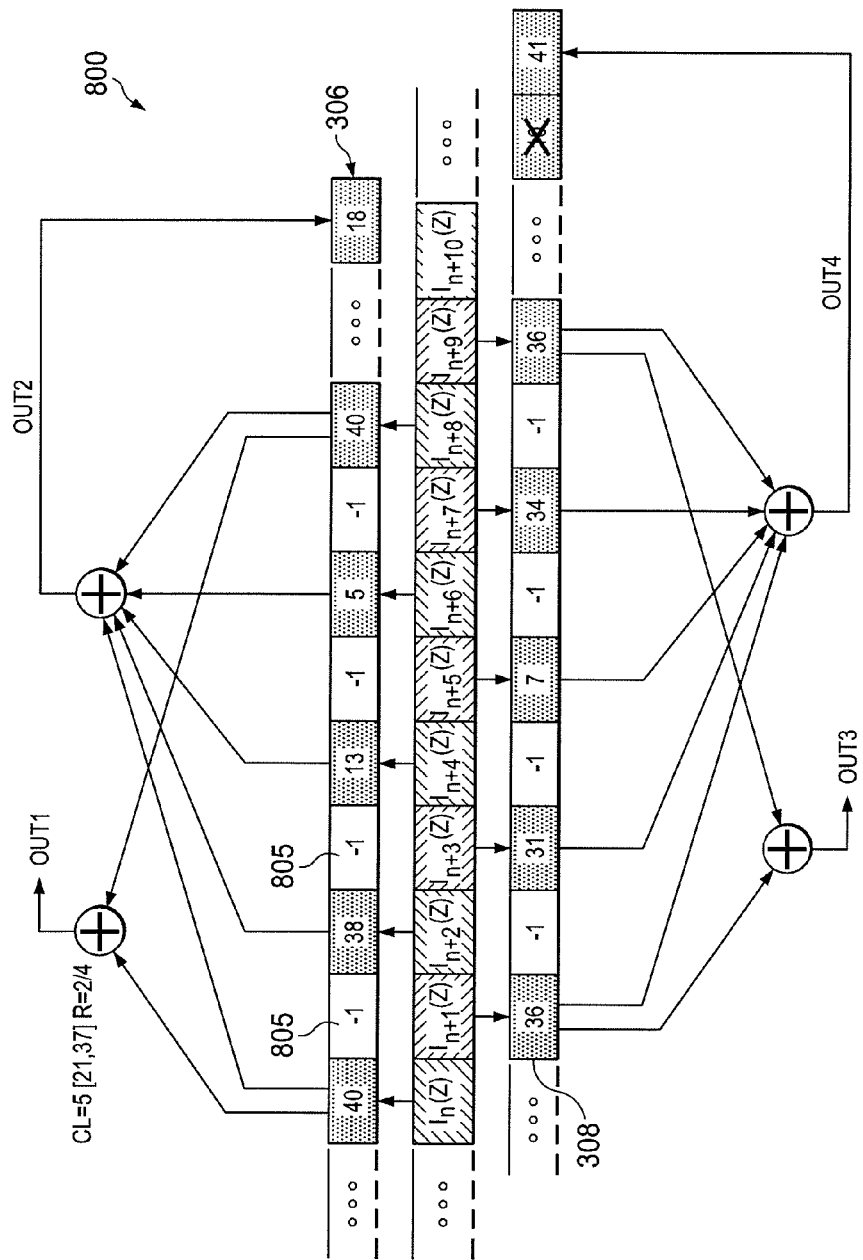
FIGS. 8A and 8B illustrate specific examples implementing the Convolutional Encoding Method of FIGS. 7A and 7B.
Figure 8B:
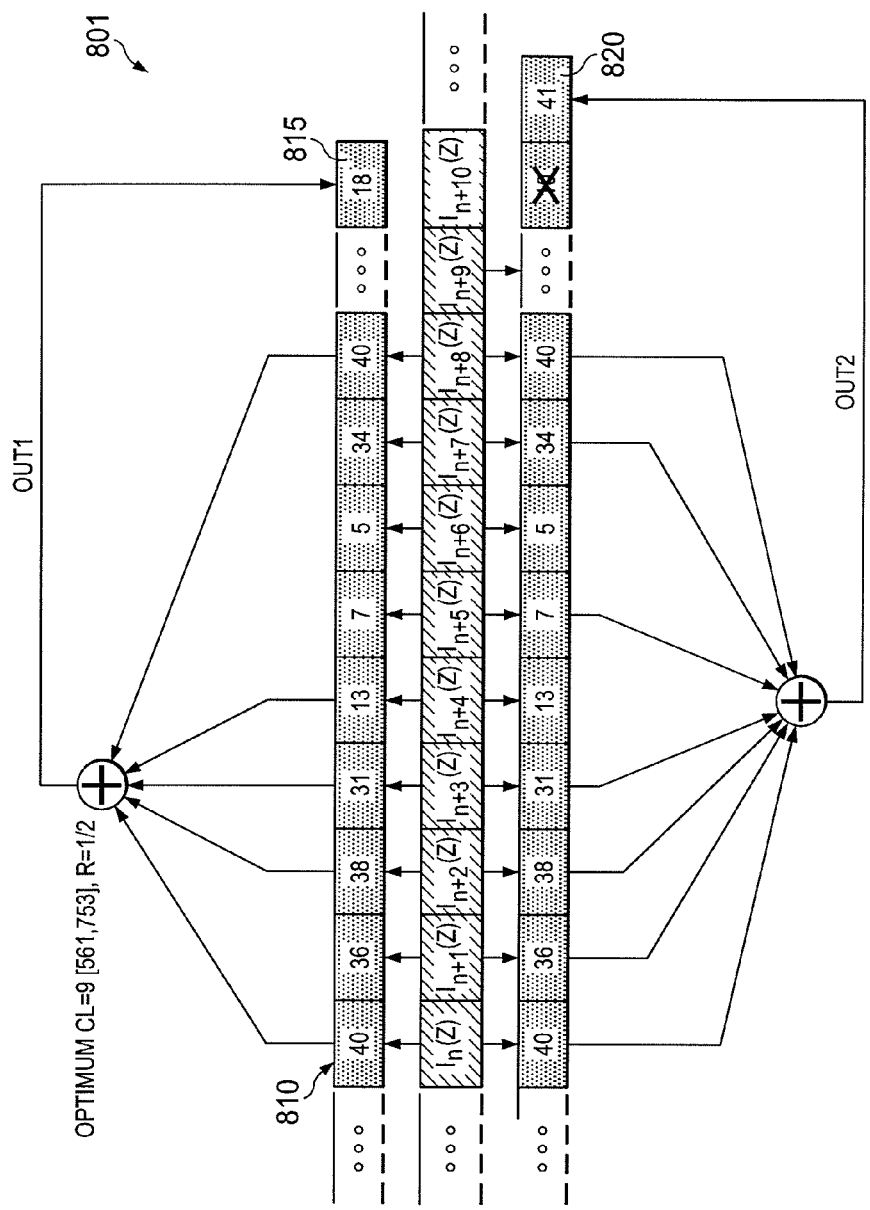

FIGS. 8A and 8B illustrate specific examples implementing the Convolutional Encoding Method 700. For example, FIG. 8A illustrates a Single-Row Convolutional Encoding Method 800 to generate the single-row convolutional encoding outputs according to embodiments of the present disclosure. FIG. 8B illustrates a Multiple Single-Row Convolutional Encoding Method 801 combined to generate the single-row convolutional encoding outputs according to embodiments of the present disclosure. The embodiments of the Single-Row Convolutional Encoding Method 800 shown in FIG. 8A and the Multiple Single-Row Convolutional Encoding Method 801 shown in FIG. 8B are for illustration only. Other embodiments could be used without departing from the scope of this disclosure. The processes 800 and 801 can be implemented by processing circuitry of a QC-LDPC convolutional encoder or a computing system (referred to generally as "system").

In FIGS. 8A and 8B, once the H-Matrix is formed, the polynomials used can be selected based on the optimal convolutional codes described in REF 18 to lower the BER. The specific example of the Single-Row Convolutional Encoding Method 800 shown in FIG. 8A and the Multiple Single-Row Convolutional Encoding Method 801 shown in FIG. 8B use the WiGig H-Matrix of FIG. 3 with rate $R=2/4$, constraint length $\lambda=5$ as a result of an encoding latency of $L=1$ and a row and column weight of $K=4$, and input granularity $\gamma=2Z=84$. In this example, Z-rows 1 and 3 are independent (with diagonalized $H_{par}$) and create a complete set; thus form a base.

Increasing the QC-LDPC convolutional code constraint length A from $(LK+1)$ to $(MLK+1)$ in Block 730 significantly lowers the BER of the QC-LDPC convolutional code. However, the decoder hardware complexity and power consumption also increases by a factor of $2^{(M-1)LK}$. Further decoder hardware complexity vs. BER performance tradeoffs are discussed below. Other constraint lengths of $(LK+1)<\lambda<(MLK+1)$ can be derived from the $\lambda=9$ code shown in FIGS. 8A and 8B by appropriately reducing the number of inner stages.

As shown in FIG. 8A, single-row methods that involve further modifications of the original block code 300 can be applied. One Single-Row Convolutional Encoding Method uses only the first Z-row 306 to encode the bits by eliminating the gaps 805 in the first Z-row 306 protograph (leading to a compression of $H_{sys}$). That is, $(-1)$ values of the rows of H-matrix 300 are gaps. However, the code periodicity is doubled due to the compression of $H_{sys}$, which will decrease the effective constraint length and consequently increase the BER. The code periodicity can be decreased by either adding a constant shift value to all the entries in the adjacent $H_{sys}$ in the concatenated code or shuffling the columns in the adjacent $H_{sys}$. In summary, single-row encoding offers a significant advantage if a single row of the H-matrix is already a base. However, if a single row of the H-matrix is not a base then significant H-matrix redesign using techniques such as $H_{par}$ diagonalization, column shuffling, and shifts adjustments are used. In using redesign techniques (namely, $H_{par}$ diagonalization, column shuffling, and shifts adjustments) when a single row of the H-matrix is not a base it can be beneficial to employ multi-row encoding.

The embodiment of the Multiple Single-Row Convolutional Encoding Method 801 shown in FIG. 8B is for illustration only. Other embodiments could be used without departing from the scope of this disclosure. The process 801 can be implemented by processing circuitry of a QC-LDPC convolutional encoder or a computing system (referred to generally as "system").

FIG. 8B includes a specific example of implementing Block 730 where the two independent rows 306 and 308 are combined into a single row with $\lambda=9$ (M=2) with $\gamma=Z=42$. For example, independent rows 306 and 308 are not consecutive such that the first row 306 is separated from the third row 308 by at least one row, namely, the second row of the matrix 300.

As describe more particularly below, the Multiple-Row Convolutional Encoding Method (1100 shown in FIG. 11) does not require the changes to the original H-Matrix 300 that the Single-Row Convolutional Encode method 800 implements. The Multiple-Row Convolutional Encoding Method 1100 generalizes and further enhances the QC-LDPC convolutional encoding by utilizing the lower triangular parity matrix ($H_{par}$) to enable a higher constraint length and lower BER, than the single-row encoding, while also maintaining minimum code latency (for example, L=1).

To generate outputs 815 and 820 of the Multiple Single-Row Convolutional Encoding Method 801 the QC-LDPC convolutional encoder combines independent rows into a single row while preserving the cyclic shift for each input Z-group bits in block 730. FIG. 7B illustrates the block 730 in greater detail.

The QC-LDPC convolutional encoder (namely, a Viterbi, trellis based encoder) selects the desired constraint length), of the QC-LDPC convolutional code in Block 735.

In block 740, the QC-LDPC convolutional encoder obtains the number of Z-rows to be selected for the encoding, which is represented by M. The relationship between λ and M is different than in the single-row encoding. In Multiple Single-Row Convolutional Encoding Method 801 the number of Z-rows to be selected for the encoding is represented by Equation 16:

$$M=\lambda(LK+1) \qquad \text{[Eqn. 16]}$$

In block 745, the QC-LDPC convolutional encoder selects the first M Z-rows of the H-Matrix as the QC-LDPC convolutional encoder generators. A group (Z-row) shuffling of the systematic portion of the H-matrix may be necessary in order to reach the least dependency between the selected systematic Z-rows. In case where the selected Z-rows form a base (independent and complete systematic set), the rate $R=R_b/M=B/(MC)$ with input granularity $\gamma=Z$. Z-row shuffling does not change the H-Matrix channel characteristics (i.e. periodicity, etc.). In addition, LDPC block H-Matrix can be initially designed with first M Z-rows as a base already.

In block 750, the QC-LDPC convolutional encoder applies $\pi=1/M$ puncturing method to increase the final rate to original $R=R_b=B/C$. In cases where a base cannot be formed with the selected Z-rows, then the final rate can be expressed by Equation 17:

$$R=B^2/((\Sigma_{i=1}^{B}Y_i)C) \qquad \text{[Eqn. 17]}$$

where $Y_i$ is the number of times Z-group i input bits is used in the set for $1 \leq i \leq B$. The row dependency affects the decoder architecture, as described below.

In block 755, the QC-LDPC convolutional encoder combines the set of M, Z-rows to form a single set of Z-parallel encoders.

As a specific and non-limiting example, a general lower triangular parity matrix ($H_{par}$), is characterized by each row encoder being dependent on the parity bits from the upper rows. As a result, the QC-LDPC convolutional decoding complexity increases with the rows and is highest for the last row.

To simplify the description of the Multiple-Row Convolutional Encoding Method, the present disclosure uses a dual-row (M=2) encoding example with an encoding rate R=1/2 H-Matrix and with systematic row weight K and encoding latency L=1. In this example, the Dual-Row or the duobinary convolutional encoder generator, G, can be described by Equation 18:

$$G = \begin{bmatrix} 1+D^K & 0 & 1+D+D^2+\ldots+D^K & 1+D+D^2+\ldots+D^K \\ 0 & 1+D^K & 0 & 1+D+D^2+\ldots+D^K \end{bmatrix} \quad [\text{Eqn. 18}]$$

As a result, the encoder output V is calculated using Equation 19:

$$V = UG \quad [\text{Eqn. 19}]$$

where U is the duobinary input bit stream, which is described by Equation 20:

$$U = [u_{1,0} + u_{1,1}D + \ldots + u_{1,n}D^n u_{2,0} + u_{2,1}D + \ldots + u_{2,n}D^n] \quad [\text{Eqn. 20}]$$

Next, the two independent streams are combined by, first interpolating the stream and the generator by two, and then multiplying by the identity matrix $$\frac{1}{D}\begin{bmatrix} D & 0 \\ 0 & 1 \end{bmatrix}\begin{bmatrix} 1 & 0 \\ 0 & D \end{bmatrix} = \begin{bmatrix} 1 & 0 \\ 0 & 1 \end{bmatrix}.$$

Hence, the interpolated output $V^2$ is given by Equation 21:

$$V^2 = U^2 G^2 = \left(\frac{U^2}{D}\begin{bmatrix} D & 0 \\ 0 & 1 \end{bmatrix}\right)\left(\begin{bmatrix} 1 & 0 \\ 0 & D \end{bmatrix}G^2\right) \quad [\text{Eqn. 21}]$$

The interpolated input $U^2$ is described by Equation 22:

$$U^2 \equiv U \uparrow 2 = [u_{1,0} + u_{1,1}D^2 + \quad [\text{Eqn. 22}]$$
$$\ldots + u_{1,n}D^{2n} \ u_{2,0} + u_{2,1}D^2 + \ldots + u_{2,n}D^{2n}]$$

$$U^{2'} = \frac{U^2}{D}\begin{bmatrix} D & 0 \\ 0 & 1 \end{bmatrix} = \frac{1}{D}[u_{1,0}D + u_{1,1}D^3 + \ldots +$$
$$u_{1,n}D^{2n+1} \ u_{2,0} + u_{2,1}D^2 + \ldots + u_{2,n}D^{2n}]$$

The two streams can be combined into one equivalent single input stream as described by Equation 23:

$$U' = \Sigma_{i=0}^{n} u_{2,i}D^{2i-1} + \Sigma_{i=0}^{n} u_{1,i}D^{2i} \quad [\text{Eqn. 23}]$$

The related interpolated generator $G^2$ is described by Equation 24:

$$G^2 = \begin{bmatrix} 1+D^{2K} & 0 & 1+D^2+D^4+\ldots+D^{2K} & 1+D^2+D^4+\ldots+D^{2K} \\ 0 & 1+D^{2K} & 0 & 1+D^2+D^4+\ldots+D^{2K} \end{bmatrix} \quad [\text{Eqn. 24}]$$

Multiplying both sides by $$\begin{bmatrix} 1 & 0 \\ 0 & D \end{bmatrix},$$

results in Equation 25:

$$\left(\begin{bmatrix} 1 & 0 \\ 0 & D \end{bmatrix}G^2\right) = \begin{bmatrix} 1+D^{2K} & 0 & 1+D^2+D^4+\ldots+D^{2K} & 1+D^2+D^4+\ldots+D^{2K} \\ 0 & D+D^{2K+1} & 0 & D+D^3+D^5+\ldots+D^{2K+1} \end{bmatrix} \quad [\text{Eqn. 25}]$$

Linear row operations do not change the code, and as a result, row 2 is added to row 1 as shown by Equation 26:

$$= \begin{bmatrix} 1+D^{2K} & D+D^{2K+1} & 1+D^2+D^4+\ldots+D^{2K} & \sum_{i=0}^{2K+1} D^i \\ 0 & D+D^{2K+1} & 0 & D+D^3+D^5+\ldots+D^{2K+1} \end{bmatrix}$$

[Eqn. 26]

The second row terms are already included in the first row terms, and as a result, the generator can be added to support a single input stream. The repetitive terms that exist in the second row are eliminated based on the relationship of the terms, $(D+D^{2K+1})$ and $(D+D^3+D^5+\ldots+D_{2K+1})$ are merely a 1-step delay, respectively, of the first row terms $(1+D^{2K})$. and $(1+D_2+D^4+\ldots+D^{2K})$.) As a result, when decimating the encoder output by a factor of 2 (Puncture $\pi=1/2$), the encoder can output only the first row terms every other output. The single stream equivalent encoder generator is represented by Equation 27:

$$G'=[1+D^{2K}D+D^{2K+1}1+D^2+D^4+\ldots+D^{2K}\Sigma_{i=0}^{2K+1}D^i]$$ [Eqn. 27]

and the final decimated outputs are obtained by Equation 28:

$$V=(U'G')\downarrow 2$$ [Eqn. 28]

This decimation results in a single input bit stream, convolutional encoder with four polynomials that are punctured by $\pi=1/2$ (final R=1/2) and constraint length $\lambda=2(K+1)$. The same process can be applied to M Multiple-Row encoding with original M input bit streams and interpolation/decimation by M. In the general case for M Multi-row encoding with latency L and systematic row weight K, the final constraint length is $\lambda=M(LK+1)$ with R=1/2. The single input bit stream can be expended to Z independent input bit streams to form the final input granularity $\gamma=Z$. Even though the final constraint length is increased from $\lambda=LK+1$ to $\lambda=M(LK+1)$, the BER will not decrease because matrix transformations were performed to create a single bit stream from M independent bit streams. As a result, the polynomials are modified to include both the 1 and $D^{2K+1}$ (for M=2) terms. The new modified polynomials are express by Equation 29:

$$G''=[1+D^{2K}+D^{2K+1}1+D+D^{2K+1}1+D^2+D^4+\ldots+D^{2K}+D^{2K+1}\Sigma_{i=0}^{2K+1}D^i]$$ [Eqn. 29]

Optimum generator polynomials can be applied to lower the BER, as described in REF18. For example, in case of $\lambda=10$ R=1/2 convolutional encoder (L=1, K=4, M=2), the optimum generator polynomials in octal representation are expressed by Equation 30:

$$G'''=[g_0,g_1,g_2,g_3]=[1467,1751,1325,1173]$$ [Eqn. 30]

where the four outputs are punctured with $\pi=1/2$. The Multiple-Row Convolutional Encoding Method can support any $\lambda$. However, the relationship of the decoder hardware complexity also increases exponentially with $\lambda$ in Trellis-based decoders due to the number of the related Trellis states. The number of states in a Trellis-based decoder can be express by Equation 31:

$$2\lambda-1=2(LK+1)M-1$$ [Eqn. 31]

An effective upper bound for M is related to the code girth g and is given as M<g/2. A looser upper bound for M is the maximum number of independent systematic Z-rows plus 1, to ensure no repetitive systematic bit is input to the encoder. By numerical observation, the BER of a constraint length $\lambda=(LK+1)g/2$ QC-LDPC convolutional code is a lower bound on the BER of the related block code (with L=1, g=6, K=4, yields $\lambda=15$). Other encoders with $(M-1)(LK+1)<\lambda<M(LK+1)$ can be derived from the M(LK+1) QC-LDPC convolutional encoder the same way as explained for $\lambda<9$ Single-row encoders described above. The constraint length for M Rows derivation can be expanded and generalized also for irregular codes according to Equation 32:

$$\lambda_M=\Sigma_{i=1}^M((\Sigma_{j=1}L^i(K_{i,j}))+1)$$ [Eqn. 32]

where $L_i$ is row i latency (in blocks), and $K_{i,j}$ is the systematic weight of row i block j.

FIG. 9 illustrates a QC-LDPC Equivalent Single-Row Convolutional Encoder according to embodiments of the present disclosure. The embodiment of the QC-LDPC Equivalent Single-Row Convolutional Encoder 900 shown in FIG. 9 is for illustration only. Other embodiments could be used without departing from the scope of this disclosure.

The QC-LDPC Equivalent Single-Row Convolutional Encoder 900 implements the Single-Row Convolutional Encoding Method, and can implement an equivalent constraint length of CL=5 {21,37}. Encoder polynomial $g_1$ is selected directly from the LDPC code 300 while encoder polynomial $g_0$ can be selected in several ways. In order to increase the rate to make it closer to the original block code transmitting Out 0 910 is avoided and only Out1' 920 is transmitted (option 0). Additional code puncturing is enables the encoder 900 to achieve higher rates such as 1/2 and above. Other options are to send the output 0 910 based on $g_0$ for non-systematic transmission (option 1), or to send directly the systematic data through Out 0 (option 2).

As described, the above CL=5 encoder description is related to a Single-Row encoder. The inputs from upper rows (for example, first row 306) that are added to the current row encoder are used in the case of Lower Triangular QC-LDPC Parity Matrix ($H_{par}$). In the case of Diagonal $H_{par}$, each row convolutional encoder acts independently (no inputs from and no dependency on upper rows). In the case of Lower Triangular $H_{par}$, the upper row dependency of the encoder effect on the decoder complexity is described below, and the same decoder complexity can achieve higher performance QC-LDPC Convolutional encoder (to get a higher power efficiency decoder).

In Equation 27, the encoder output V is derived from the new CL=10 decimated G' generator with new polynomials [$g_0$, $g_1$, $g_2$, $g_3$]'=[401, 1002, 525, 1777]' decimated by 2. However, the related convolutional decoder (Viterbi) performance of the new equivalent CL=10 encoder is expected to be exactly the same as the original two CL=5 independent streams, because some matrix manipulations to create a single bit stream from two independent bit streams were performed, which does not affect the input streams. Hence, the last step that needs to be taken will be to adjust the polynomials to create a real CL=10 convolutional encoder. This is done by adjusting each polynomial to include both 1, and $D^9$. The new modified polynomials are expressed in Equation 29B:

$$G'''=[g_0,g_1,g_2,g_3]'''=[1467,1751,1325,1173]'''$$ [Eqn. 29B].

The Equation 29B is based from the Equation 29.

Figure 10:
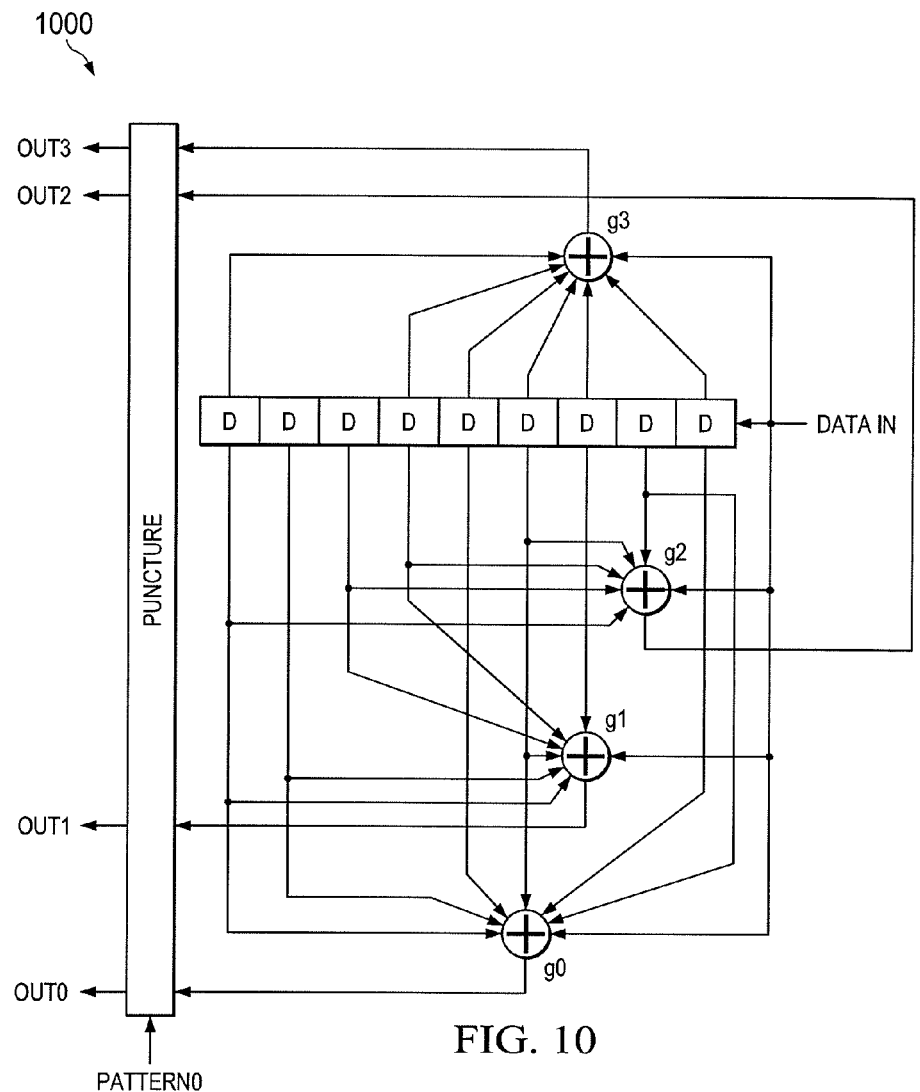
FIG. 10 illustrates a Dual-Row Equivalent QC-LDPC Equivalent Single-Row Convolutional Encoder according to embodiments of the present disclosure.

FIG. 10 illustrates a Dual-Row Equivalent QC-LDPC Equivalent Single-Row Convolutional Encoder according to embodiments of the present disclosure. The embodiment of the Dual-Row Equivalent QC-LDPC Equivalent Dual-Row Convolutional Encoder 1000 shown in FIG. 10 is for illustration only. Other embodiments could be used without departing from the scope of this disclosure.

FIG. 10 illustrates an encoding rate equivalent of R=1/2, CL=10 created by using modified dual rows QC-LDPC Convolutional encoder. The Dual-Row Convolutional Encoder 1000 describes the new equivalent R=1/2, CL=10 created by using modified dual rows QC-LDPC Convolutional encoder in Equation 30).

Pattern 0 in FIG. 10 illustrates is responsible for the puncturing. One example for P=1/2 (i.e. 8/16) is: 1101,0100,1011, 0010, where 1 denotes a transmitted output and 0 denotes a punctured output. The impact of the encoder modifications described in FIG. 10 and other modifications that are explained below, on the QC-LDPC encoding method described in above sections, is that additional systematic bits from the same or other Z-group bits are used in the Dual-Row encoding process and also some of the bits that were used in the Single-Row encoder are excluded from the Dual-Row encoder. The same approach can be done for other M-bit input streams (equivalent to M-Rows LDPC Convolutional Encoding) to create a CL=5M equivalent convolutional encoder. For example, in WiGig systems (see, e.g., REF6), the first three Z-Rows cover the whole systematic inputs. In this case we can create an equivalent M=3, CL=15 convolutional encoder that can be derived by the same method described above. In the WiGig systems, we can disregard (puncture) the rest of the H-Matrix Z-rows since they can be regarded as repetitions for the first three Z-rows or we can alternate the puncturing between the rows. However, we need to take in account that the related Viterbi decoder complexity is also exponentially increasing $O(2^{CL-1}=2^{5M-1})$ based on the number of the related Trellis states (i.e. $2^{5M-1}$). Other encoders with 5M−5<CL<5M can be derived from the CL=5M QC-LDPC Convolutional encoder the same as explained for CL<9 encoders above.

As an example, only Z-Row 1 306, and row 3 308 are processed (for final CL=10). In order to skip Z-Row 2 H-Matrix is modified by replacing Z-Row 2, with Z-Row 3 308 and interpolating the New H-Matrix by 2. FIG. 10 describes the equivalent modified H-Matrix using G''' given optimum punctured by 2 R=1/4 polynomials in Equation 30.

Figure 11:
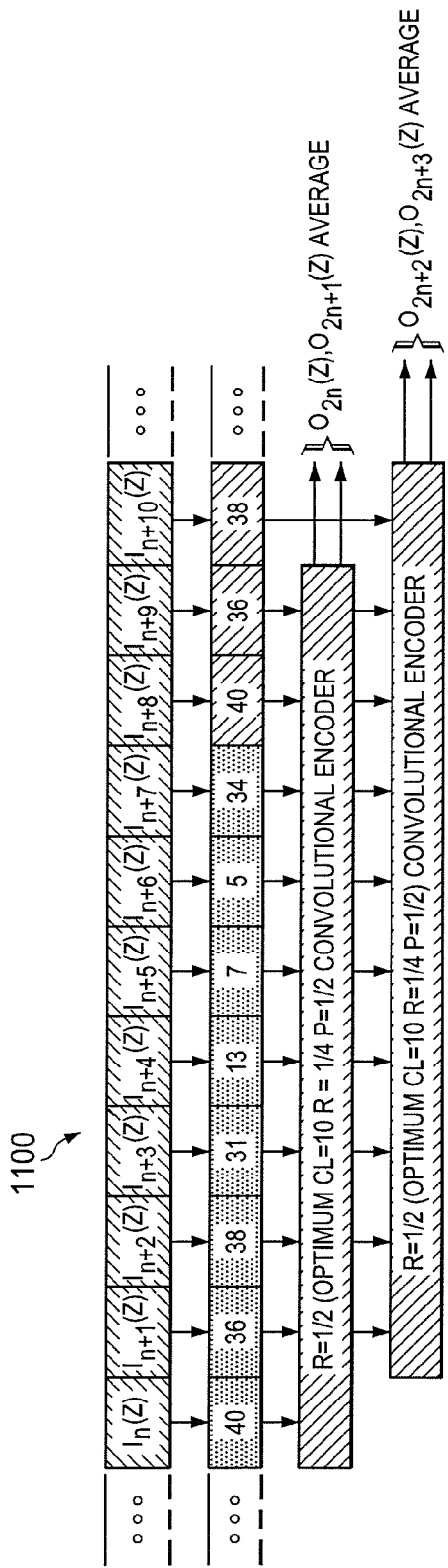
FIG. 11 illustrates the Multiple-Row Convolutional encoder block diagram according to embodiments of the present disclosure.

FIG. 11 illustrates the Multiple-Row Convolutional encoder 1100 block diagram according to embodiments of the present disclosure. As shown, the same WiGig H-Matrix 300 is used to in the example shown. Only Z-row 1 306 and 3 308 are processed (M=2, L=1, K=4 for final 2=10). In order to skip Z-row 2, the encoder modifies the H-Matrix 300 by replacing systematic Z-row 2, with Z-row 3 308 and interpolating the new H-Matrix by 2. FIG. 11 describes the equivalent modified H-Matrix using G''' given optimum punctured by π=1/2, R=1/4 polynomials in Equation 30. One π=1/2 puncturing method example is 16-bit puncture pattern: 1101, 0100,1011,0010, where 1 denotes a transmitted output and 0 denotes a punctured output.

FIG. 12 illustrates another example of a WiGig H-Matrix 1200 according to embodiments of the present disclosure. The Single-Row Convolutional Encoding Method 800 and the Multiple-Row Convolutional Encoding Method 801 can also be applied to other block code rates. The WiGig H-Matrix 1200 includes a H-Matrix with an encoding rate of $R_b$=13/16,and a row weight of Wr=16 and the related single-row constraint length is λ=14. In this case, the Single-Row Convolutional Encoding Method 800 can be easily applied because any single Z-row (M=1) is already a base. The original R=1/2 λ=14 convolutional encoders are used with alternating the Z-rows with a puncturing factor π=10/16 (i.e. 1100,1100,1100,1111) to provide final rate R=12/15.

The embodiments of the present disclosure decrease the power consumption of the QC-LDPC convolutional decoder architectures for the code encoded by the QC-LDPC convolutional encoder that implements the Single-Row Convolutional Encoding Method 800 and Multiple-Row Convolutional Encoding Method 801.

According to the present disclosure, the decoder hardware complexity is defined as X, to estimate the decoder power consumption and quantify the performance of various decoders using this metric. The complexity, X, is defined as the product of the number of gates (Die Size) and the number of logic stages required within a clock cycle ($T_{cyc}$) to meet the given data rate r. The actual decoder power consumption is proportional to X, where the proportionality constant (typically in pJ/bit) depends on the process technology used to implement the decoder. The power consumption of a coded system is also influenced by two main parameters for a given BER and data rate (r):

1. HW power consumption, $P_{DEC}(X)$, which is directly proportional to the decoder complexity, X; and
2. The transmitter PA power, $P_{PA}(SNR)$, which is directly proportional to the received SNR The desired BER requirement translates into an equivalent minimum receiver SNR requirement. The power efficiency of a system, given the BER and data rate r, is increased when the total power required to achieve the given BER at rate r is reduced. The system power reduction is achieved by reducing the hardware complexity and/or the minimum SNR. The present disclosure describes three main low power decoding techniques for QC-LDPC convolutional code and compares their HW complexity. The decoders are: i) Scaled Min-Sum Flooding decoder, ii) Scaled Min-Sum Layered decoder, and iii) A Trellis-based Quasi-Cyclic Viterbi decoder.

The first two decoders are mainly used for LDPC block codes and are described in REF 14. Both the Flooding and the Layered decoder are iterative methods that are based on BP. These decoders rely on finding the minimum variable node (VN) value among all VNs that are connected to a certain check node (CN).

The Flooding approach assigns parallel minimum (min) processors each of which operates on a different row in the H-Matrix. All CN entries per VN are summed to produce the extrinsic information for the next iteration. A key advantage of the flooding architecture is that the processing rate per iteration is high. However, flooding requires a large number of iterations to converge since all the processors work simultaneously on the extrinsic values from the previous iteration.

The Layered approach is slower than the Flooding approach in terms of number of cycles per iteration since the processing is done sequentially for each row in the H-Matrix while updating the extrinsic values in each row before proceeding to the next row. The Layered approach serially processes each row to avoid contention, but the process can be done in parallel on all independent rows in the H-Matrix. However, the Layered approach requires fewer iterations to converge to the same BER performance as the Flooding approach (typically 33% fewer iterations as described in REF14). As a result of the Layered approach being a contention-free method, only one Check Node (CN) is used at a time per VN. As a result, unlike the Flooding approach, the Layered approach does not require a summation of the CN results after every iteration, thus further reducing the number of logic stages and reducing the critical path.

The hardware complexity, $X_{MS}$, of both those methods (excluding the extra sum operations needed for the Flooding approach) depends on the quantity and the number of elements over which the minimum operator is performed to meet a given BER performance and data rate r. Table 1 describes the combined Min and Next-Min (One value greater than the Min value) detector complexity based on the row weight $W_r$. The numbers are referenced to a single 2-to-1 comparator (Die Size and Stages).

TABLE NO. 1

Scaled Min-Sum decoder Min/NextMin Complexity (Ref. 2-to-1)

| Min/NextMin Detection | Die Size | Stages | Complexity |
|---|---|---|---|
| 2-to-2 | 1 | 1 | 1 |
| 4-to-2 | 5 | 3 | 15 |
| 8-to-2 | 13 | 5 | 65 |
| 16-to-2 | 29 | 7 | 203 |
| $2^n$-to-2 | $2^{(n+1)} - 3$ | $2n - 1$ | $(2^{(n+1)} - 3)(2n - 1)$ |

In Table 1, n=ceil (log $W_r$). The hardware complexity, $X_{MS}$, also depends on the number of CNs which is given by $N_b$ (1−$R_b$), and the number of iterations, which is denoted by I. The overall hardware complexity, $X_{MS}$, is expressed by Equation 33 (where $W_r$ is already or rounded to the next higher power-of-2 value $W_r'$):

$$X_{MS} = A_{QC} N_b (1-R_b) I (2W_r'-3)(2 \log W_r'-1) \quad [\text{Eqn. 33}]$$

where $A_{QC}$ is the single 2-to-1 comparator hardware complexity (with the associated memories) [pJ/bit]. For example, the R=1/2 WiGig 8-to-2 Min/Next-Min detector includes 5 2-to-2 comparator stages and 13 comparators per row. The Flooding decoder works in parallel on all 336 R=1/2 H-Matrix rows which result with complexity factor of 336×65=21,840 per iteration. The Flooding decoder hardware complexity linearly increases with the number of iterations. The Layered decoder also consists of 8-to-2 Min/Next-Min detectors. The Layered decoder works in serial on the 8 R=1/2 H-Matrix Z(42)-rows which also results in a complexity factor of 8×42×65=21,840 per iteration. The hardware complexity also linearly increases with the number of iterations.

The third decoder is the Trellis-based QC-Viterbi decoder according to embodiments of the present disclosure. The QC-Viterbi decoder can decode the proposed QC-LDPC convolutional codes and can perform Viterbi decoding (as described in REF16 and REF17) for both Single-Row and Multi-Row Quasi-Cyclic codes. One difference between the conventional Viterbi decoder and QC-Viterbi decoder is that the input ordering to the QC-Viterbi decoder is aligned to the QC-LDPC convolutional H-Matrix code. The QC-Viterbi decoder includes $2^{\lambda-1}$ Add-Compare-Select (ACS) Path Metric (PM) states. Each PM state consists of one 2-to-1 comparator, which yields a total of $2^{\lambda-1}$ parallel 2-to-1 comparators per row. Unlike the LDPC decoder in REF22, the QC-Viterbi decoder is non-iterative and its Traceback latency in bits does not exceed 5×($N_b R_b$+Z). A premise of the present disclosure is that the memory is included in the complexity. The hardware complexity, $X_{QC-VIT}$, depends on the constraint length ($\lambda$), $A_{QC}$, and number of decoders (Z) and is given by Equation 34:

$$X_{QC-VIT} = A_{QC}(Z 2^{\lambda-1}) \quad [\text{Eqn. 34}]$$

Both Flooding and Layered decoders support processing of non-independent rows which implies multiple decision values per VN. The QC-Viterbi decoder decision path can be modified to support conflicting decisions per bit. The decision can be done based on random selection, majority vote, or other methods.

Figure 13:
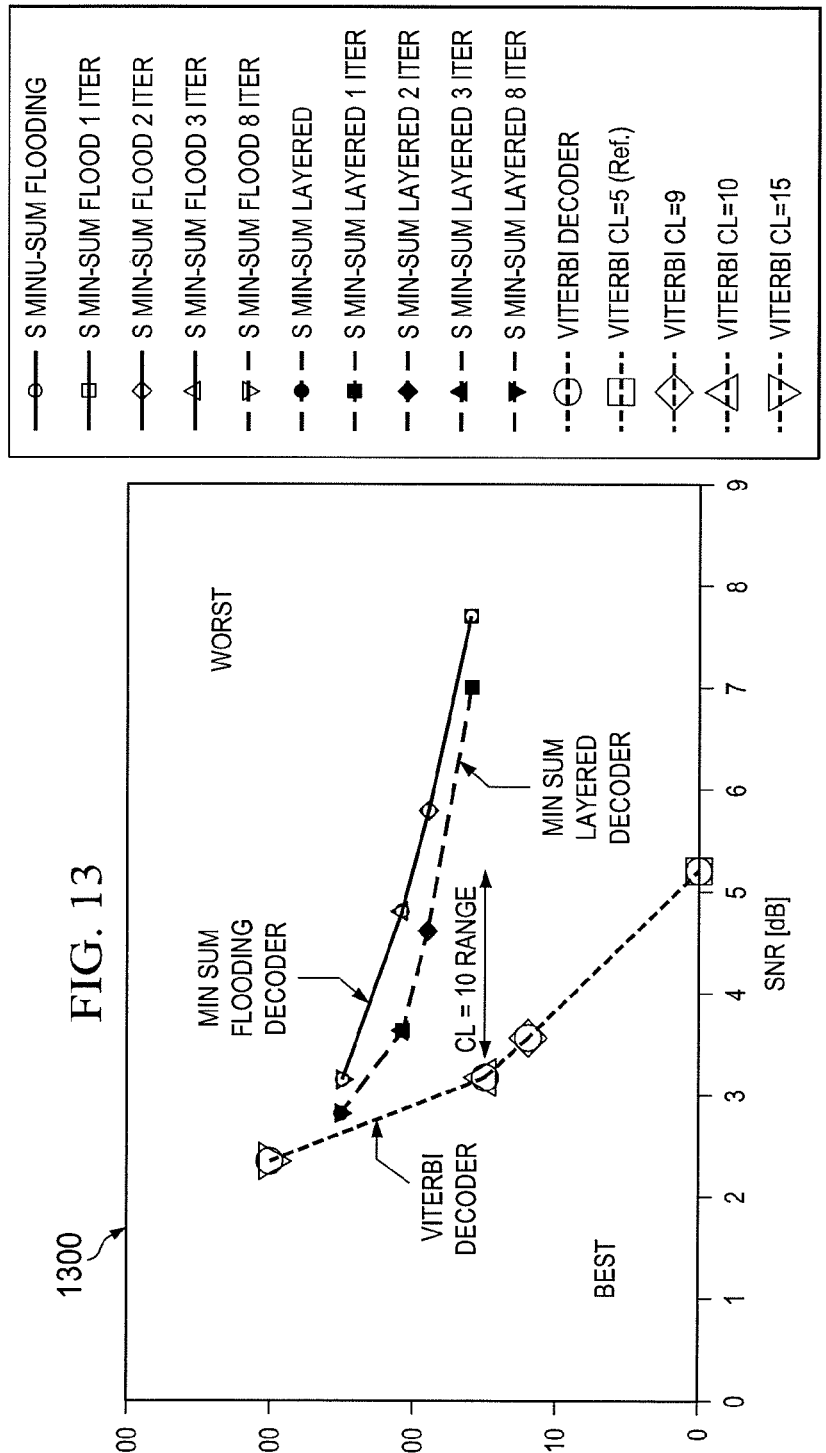
FIG. 13 illustrates a Decoder Power efficiency chart according to embodiments of the present disclosure.

FIG. 13 illustrates a Decoder Power efficiency chart 1300 according to embodiments of the present disclosure. The graph shows the amount of hardware complexity that a decoder with an encoding rate of R=1/2 has in order to meet a BER of $10^{-5}$ at a specified SNR versus decoder normalized complexity the decoder complexity of QC-LDPC convolutional decoder and compare it to the conventional decoders for LDPC block codes. That is, FIG. 13 graphically compares the decoders HW complexity vs. SNR given BER=1E-5 and data rate.

From FIG. 13 it is evident that at R=1/2 the QC-Viterbi decoder Power Efficiency of $\lambda$=10 is >3 dB better than the conventional Min-Sum LDPC decoder. Even for non-optimum $\lambda$=10 codes described above that their decoding performance can range anywhere between the $\lambda$=5 to optimum $\lambda$=10, still the non-optimum $\lambda$=10 has >4 dB lower SNR than the conventional Scaled Min-Sum LDPC decoders for a given complexity (i.e., factor of 32). The optimum $\lambda$=10 decoder has 6× less complexity than the conventional Scaled Min-Sum LDPC decoders for a given SNR (i.e. 3.16 dB). The I=100 iterations, $v_s$=155 ($\gamma$=155) Costello convolutional LDPC Sum-Product (SPA) decoder complexity (See REF22) is 3× higher than the $\lambda$=15 QC-Viterbi decoder complexity and with 0.15 dB higher (worse) minimum SNR and 100 times larger latency. Costello convolutional LDPC Sum-Product (SPA) decoder of REF22 performance was not given for lower than 100 iterations but as quoted in REF22: "LDPC block code decoders and LDPC convolutional code decoders have the same computational complexity per decoded bit and per iteration", the Costello code BER performance can be safely assumed to match the Min-Sum Layered decoder performance in lower iterations. FIG. 13 also shows that a Min-Sum LDPC decoder SNR/BER performance is lower bounded by $\lambda$=15 QC-Viterbi SNR/BER performance for a given data rate. Since the WiGig H-Matrix girth is g=6 (3-rows cycle) it corresponds to M=g/2=3 that bounds the related WiGig block code by $\lambda$=(LK+1)M=5 g/2=15 (L=1) QC-LDPC convolutional code performance (verified up to the same complexity). The same comparison was done for R=13/16 and results showed 0.2 dB lower SNR of the punctured $\lambda$=14 QC-Viterbi decoder than the corresponding R=13/16 Scaled Min-Sum LDPC decoders given complexity factor of 320.

The QC-LDPC convolutional code coupled with Trellis-based decoding architecture allows achieves low latency with significant power efficiency improvement over conventional LDPC block codes and LDPC convolutional codes.

Table 2 provides test parameters and conditions used in a simulation.

TABLE NO. 2

QC-LDPC Convolutional Code & Decoding Parameters

| QC-LDPC Conv. Code & Decoder Parameters | Values |
|---|---|
| Syndrome Former Memory $m_s = N_b R_b$ | 672 × 1/2 = 336 bits, 672 × 13/16 = 546 bits |
| H-Matrix Rate | WiGig 1/2, 13/16 |
| Lifting Factor (Z) | 42 bits |
| Input Granularity (bits) | G = 2Z = 84 bits |
| Parity Check Matrix form | Lower Triangular |
| FF/Traceback processing periods in bits | 320Z bits = 13440 bits |
| Output Period in bits | 80Z bits = 3360 bits |
| Constraint-Lengths | CL = J + 1 = 5 to 15 |
| Channel Model | AWGN |
| Modulation Scheme | QPSK |

Although the present disclosure has been described with reference to an example, various changes and modifications may be suggested to one skilled in the art. It is intended that the present disclosure encompass such changes and modifications as fall within the scope of the appended claims.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A low-density parity check (LDPC) encoding method for increasing constraint length, the method comprising:
    determining an LDPC code block H-matrix including a systematic submatrix ($H_{sys}$) of input systematic data and a parity check submatrix ($H_{par}$) of parity check bits;
    diagonalizing the parity check submatrix ($H_{par}$);
    identifying a set of rows of the LDPC code block H-matrix that form a complete set of the input systematic data;
    selecting an input bit granularity ($\gamma$) and encoding latency;
    obtaining a quasi-cyclic LDPC (QC-LDPC) convolutional code H-Matrix; and
    combining the set of rows into a single row.

2. The method of claim 1, wherein diagonalizing the parity check submatrix comprises disabling non-diagonal elements of the $H_{par}$.

3. The method of claim 1, wherein identifying the set of rows of the H-matrix comprises selecting rows of the LDPC code block H-Matrix that are not consecutive.

4. The method of claim 1, wherein selecting the input bit granularity comprises verifying that a first cyclic shift of $\gamma$ first bits includes a same number $\gamma$ of bits as a last cyclic shift of $\gamma$ last bits.

5. The method of claim 1, wherein combining the set of rows into a single row comprises using a single row of the LDPC code block H-matrix to fill gaps in another row of the LDPC code block H-matrix.

6. The method of claim 1, wherein combining the set of rows into a single row comprises using multiple rows of the LDPC code block H-matrix to fill gaps in a row of the LDPC code block H-matrix to be encoded.

7. The method of claim 6, further comprising:
    selecting a constraint length $\lambda$ of the QC-LDPC convolutional code H-matrix;
    obtaining a number (M) of Z-rows to be selected for encoding, wherein the multiple rows are M rows;
    selecting a first M Z-rows of the LDPC code block H-Matrix as QC-LDPC convolutional encoder generators; and
    filling the gaps of the row of the LDPC code block H-matrix to be encoded using the QC-LDPC convolutional encoder generators.

8. A quasi-cyclic-low-density parity check (QC-LDPC) convolutional encoder comprising:
    a convolutional encoder configured to:
        determine an LDPC code block H-matrix including a systematic submatrix ($H_{sys}$) of input systematic data and a parity check submatrix ($H_{par}$) of parity check bits;
        diagonalize the parity check submatrix ($H_{par}$);
        identify a set of rows of the LDPC code block H-matrix that form a complete set of the input systematic data;
        select an input bit granularity ($\gamma$) and encoding latency;
        obtain a quasi-cyclic LDPC (QC-LDPC) convolutional code H-Matrix; and
        combine the set of rows into a single row.

9. The QC-LDPC convolutional encoder of claim 8, further configured to diagonalize the parity check submatrix by disabling non-diagonal elements of the $H_{par}$.

10. The QC-LDPC convolutional encoder of claim 8, wherein identify the set of rows of the H-matrix by selecting rows of the LDPC code block H-Matrix that are not consecutive.

11. The QC-LDPC convolutional encoder of claim 8, wherein selecting the input bit granularity comprises verifying that a first cyclic shift of $\gamma$ first bits includes a same number $\gamma$ of bits as a last cyclic shift of $\gamma$ last bits.

12. The QC-LDPC convolutional encoder of claim 8, wherein combining the set of rows into a single row comprises using a single row of the LDPC code block H-matrix to fill gaps in another row of the LDPC code block H-matrix.

13. The QC-LDPC convolutional encoder of claim 8, wherein combining the set of rows into a single row comprises using multiple rows of the LDPC code block H-matrix to fill gaps in a row of the LDPC code block H-matrix to be encoded.

14. The QC-LDPC convolutional encoder of claim 13, further configured to:
    select a constraint length $\gamma$ of the QC-LDPC convolutional code H-matrix;
    obtain a number (M) of Z-rows to be selected for encoding, wherein the multiple rows are M rows;
    select a first M Z-rows of the LDPC code block H-Matrix as QC-LDPC convolutional encoder generators; and
    fill the gaps of the row of the LDPC code block H-matrix to be encoded using the QC-LDPC convolutional encoder generators.

15. A quasi-cyclic low-density parity check (QC-LDPC) convolutional Viterbi decoder comprising:
    a Viterbi decoder configured to receive a QC-LDPC convolutional code block from a QC-LDPC convolutional encoder and decode the QC-LDPC convolutional code block in one iteration, wherein the QC-LDPC convolutional encoder is configured to generate the QC-LDPC convolutional code block by:
        determining an LDPC code block H-matrix including a systematic submatrix ($H_{sys}$) of input systematic data and a parity check submatrix ($H_{par}$) of parity check bits;
        diagonalizing the parity check submatrix ($H_{par}$);
        identifying a set of rows of the LDPC code block H-matrix that form a complete set of the input systematic data;
        selecting an input bit granularity ($\gamma$) and encoding latency;
        obtaining a quasi-cyclic LDPC (QC-LDPC) convolutional code H-Matrix; and
        combining the set of rows into a single row with an increased constraints length $\lambda$.

16. The QC-LDPC convolutional Viterbi decoder of claim 15, wherein diagonalizing the parity check submatrix comprises disabling non-diagonal elements of the $H_{par}$.

17. The QC-LDPC convolutional Viterbi decoder of claim 15, wherein identifying the set of rows of the LDPC code block H-matrix comprises selecting rows of the H-Matrix that are not consecutive.

18. The QC-LDPC convolutional Viterbi decoder of claim 15, wherein selecting the input bit granularity comprises verifying that a first cyclic shift of $\gamma$ first bits includes a same number $\gamma$ of bits as a last cyclic shift of $\gamma$ last bits.

19. The QC-LDPC convolutional Viterbi decoder of claim 15, wherein combining the set of rows into a single row comprises using a single row of the LDPC code block H-matrix to fill gaps in another row of the LDPC code block H-matrix.

20. The QC-LDPC convolutional Viterbi decoder of claim 15, wherein combining the set of rows into a single row comprises using multiple rows of the LDPC code block H-matrix to fill gaps in a row of the LDPC code block H-matrix to be encoded; and
  wherein the QC-LDPC convolutional encoder is further configured to:
    select a constraint length $\lambda$ of the QC-LDPC convolutional code H-matrix;
    obtain a number (M) of Z-rows to be selected for encoding, wherein the multiple rows are M rows;
    select a first M Z-rows of the LDPC code block H-Matrix as QC-LDPC convolutional encoder generators; and
    fill the gaps of the row of the LDPC code block H-matrix to be encoded using the QC-LDPC convolutional encoder generators.

* * * * *